(12) United States Patent
Omura

(10) Patent No.: US 12,259,410 B2
(45) Date of Patent: Mar. 25, 2025

(54) ROGOWSKI-TYPE CURRENT SENSOR AND INVERTER, AND METHOD OF MOUNTING ROGOWSKI-TYPE CURRENT SENSOR

(71) Applicant: KYUSHU INSTITUTE OF TECHNOLOGY, Fukuoka (JP)

(72) Inventor: Ichiro Omura, Fukuoka (JP)

(73) Assignee: KYUSHU INSTITUTE OF TECHNOLOGY, Fukuoka (JP)

( * ) Notice: Subject to any disclaimer, the term of this patent is extended or adjusted under 35 U.S.C. 154(b) by 0 days.

(21) Appl. No.: 18/282,961

(22) PCT Filed: Mar. 10, 2022

(86) PCT No.: PCT/JP2022/010621
§ 371 (c)(1),
(2) Date: Sep. 19, 2023

(87) PCT Pub. No.: WO2022/202367
PCT Pub. Date: Sep. 29, 2022

(65) Prior Publication Data
US 2024/0168062 A1 May 23, 2024

(30) Foreign Application Priority Data

Mar. 24, 2021 (JP) ................................. 2021-050490
Sep. 21, 2021 (JP) ................................. 2021-152900

(51) Int. Cl.
*G01R 15/18* (2006.01)
*G01R 19/00* (2006.01)
*H05K 1/02* (2006.01)

(52) U.S. Cl.
CPC ....... *G01R 15/181* (2013.01); *G01R 19/0092* (2013.01); *H05K 1/028* (2013.01); *H05K 2201/10151* (2013.01)

(58) Field of Classification Search
CPC .. G01R 15/181; G01R 19/0092; H05K 1/028; H05K 2201/10151
(Continued)

(56) References Cited

U.S. PATENT DOCUMENTS

| 7,230,413 B2 | 6/2007 | Zhang et al. |
| 10,976,352 B2 | 4/2021 | Nomura et al. |

(Continued)

FOREIGN PATENT DOCUMENTS

| CN | 101044408 A | 9/2007 |
| CN | 111064454 A | 4/2020 |

(Continued)

OTHER PUBLICATIONS

Office Action issued in Chinese Patent Application No. 202280021714.3 dated Mar. 6, 2024, with English Translation (29 pages).
(Continued)

*Primary Examiner* — Tung X Nguyen
*Assistant Examiner* — Robert P Alejnikov, Jr.
(74) *Attorney, Agent, or Firm* — Nakanishi IP Associates, LLC

(57) ABSTRACT

Provided are a Rogowski-type current sensor capable of being flexibly deformed and easily mounted even when a clearance is narrow, an inverter, and a method of mounting a Rogowski-type current sensor. A main body of a Rogowski-type current sensor is formed from a belt-shaped flexible wiring board. The main body includes a measuring portion in which a Rogowski coil is formed in a length direction by a conductive pattern. When measuring a current flowing through a wiring of a measurement target, the main body is mounted such that it is bent in an annular shape to surround the wiring of the measurement target, and front surfaces (first main surfaces) are overlaid with each other so as to surround the wiring of the measurement target.

19 Claims, 18 Drawing Sheets

| | | COVER FILM | | 12.5μm |
|---|---|---|---|---|
| | | ADHESIVE LAYER | | 15μm |
| | SHIELD LAYER | COPPER PLATING LAYER | | 10μm |
| | | SPECIAL ELECTROLYTIC COPPER FOIL | | 9μm |
| FIRST LAYER | | BASE FILM | | 12.5μm |
| | | BONDING SHEET | | 25μm |
| | FIRST PATTERN LAYER | COPPER PLATING LAYER | | 10μm |
| | | SPECIAL ELECTROLYTIC COPPER FOIL | | 9μm |
| SECOND LAYER | | BASE FILM | | 12.5μm |
| | | BONDING SHEET | | 25μm |
| | SECOND PATTERN LAYER | SPECIAL ELECTROLYTIC COPPER FOIL | | 9μm |
| SPACE LAYER | | BASE FILM | | 50μm |
| | | BONDING SHEET | | 25μm |
| THIRD LAYER | | BASE FILM | | 50μm |
| | THIRD PATTERN LAYER | SPECIAL ELECTROLYTIC COPPER FOIL | | 9μm |
| | | COPPER PLATING LAYER | | 10μm |
| | | BONDING SHEET | | 25μm |
| | SHIELD LAYER | SPECIAL ELECTROLYTIC COPPER FOIL | | 9μm |
| | | COPPER PLATING LAYER | | 10μm |
| | | ADHESIVE LAYER | | 15μm |
| | | COVER FILM | | 12.5μm |

(58) Field of Classification Search
USPC .......................................................... 324/127
See application file for complete search history.

(56) References Cited

U.S. PATENT DOCUMENTS

| | | | | |
|---|---|---|---|---|
| 2006/0082356 | A1* | 4/2006 | Zhang | G01R 15/181 324/117 R |
| 2012/0126789 | A1* | 5/2012 | Turpin | G01R 15/181 324/117 R |
| 2014/0125321 | A1* | 5/2014 | Dames | G01R 15/186 324/127 |
| 2014/0333284 | A1* | 11/2014 | Dames | G01R 3/00 29/602.1 |
| 2015/0271909 | A1* | 9/2015 | Brooks | H05K 1/028 324/127 |
| 2019/0346486 | A1* | 11/2019 | Nomura | G01R 19/0092 |
| 2020/0150150 | A1* | 5/2020 | Nomura | G01R 15/181 |

FOREIGN PATENT DOCUMENTS

| | | |
|---|---|---|
| CN | 111370199 A | 7/2020 |
| GB | 2509965 B | 7/2014 |
| JP | 2005-257336 A | 9/2005 |
| JP | 2008-241480 A | 10/2008 |
| JP | 2010-531452 A | 9/2010 |
| JP | 2019-196962 A | 11/2019 |
| JP | 2020-076706 A | 5/2020 |
| JP | 2020-076707 A | 5/2020 |
| JP | 6709918 B2 | 6/2020 |
| WO | 2017/014297 A1 | 1/2017 |

OTHER PUBLICATIONS

International Search Report issued in PCT/JP2022/010621 mailed on May 17, 2022 with English Translation (9 pages).
Written Opinion of International Searching Authority issued in PCT/JP2022/010621 mailed on May 17, 2022 with English Translation (9 pages).
International Preliminary Report on Patentability issued in PCT/JP2022/010621 dated on Apr. 5, 2023, with English Translation (6 pages).
Office Action issued in German Patent Application No. 11 2022 001 756.2, dated Aug. 8, 2024, with English Translation (8 pages).

* cited by examiner

Figure 7A
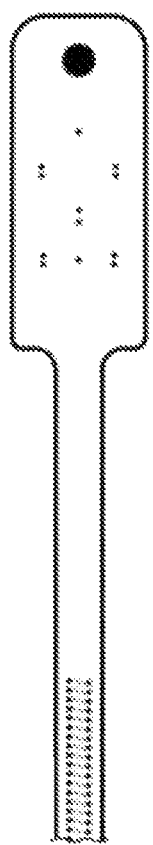
Figure 7B
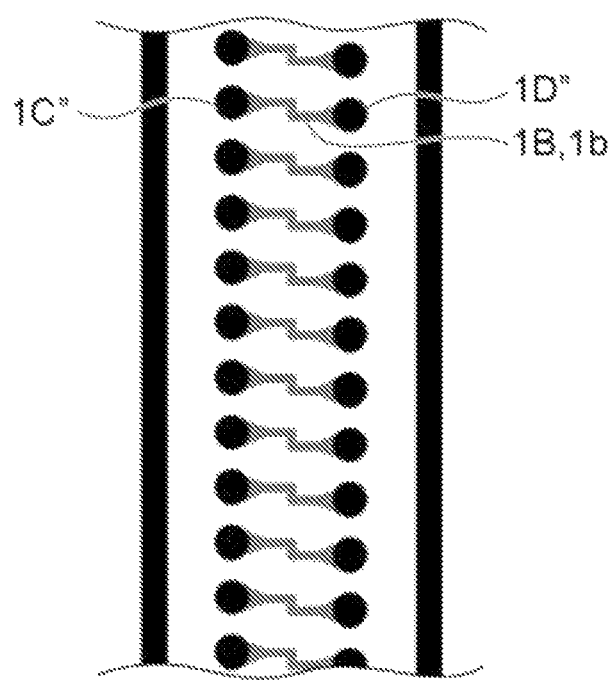

Figure 8

| | | | |
|---|---|---|---|
| | COVER FILM | | 12.5μm |
| | ADHESIVE LAYER | | 15μm |
| SHIELD LAYER | | COPPER PLATING LAYER | 10μm |
| | | SPECIAL ELECTROLYTIC COPPER FOIL | 9μm |
| FIRST LAYER | BASE FILM | | 12.5μm |
| | BONDING SHEET | | 25μm |
| | FIRST PATTERN LAYER | COPPER PLATING LAYER | 10μm |
| | | SPECIAL ELECTROLYTIC COPPER FOIL | 9μm |
| SECOND LAYER | BASE FILM | | 12.5μm |
| | BONDING SHEET | | 25μm |
| | SECOND PATTERN LAYER | SPECIAL ELECTROLYTIC COPPER FOIL | 9μm |
| SPACE LAYER | BASE FILM | | 50μm |
| | BONDING SHEET | | 25μm |
| THIRD LAYER | BASE FILM | | 50μm |
| | THIRD PATTERN LAYER | SPECIAL ELECTROLYTIC COPPER FOIL | 9μm |
| | | COPPER PLATING LAYER | 10μm |
| | BONDING SHEET | | 25μm |
| SHIELD LAYER | | SPECIAL ELECTROLYTIC COPPER FOIL | 9μm |
| | | COPPER PLATING LAYER | 10μm |
| | ADHESIVE LAYER | | 15μm |
| | COVER FILM | | 12.5μm |

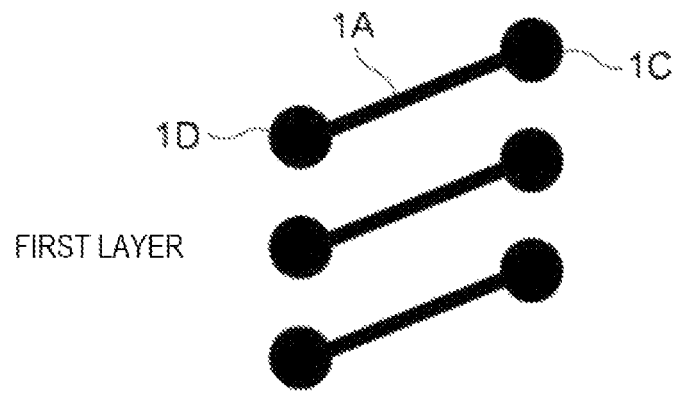
Figure 19A  FIRST LAYER
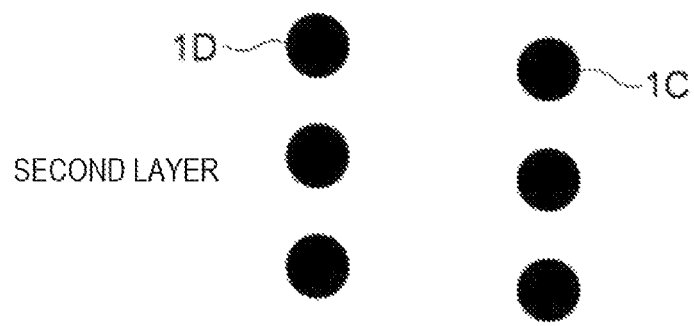
Figure 19B  SECOND LAYER
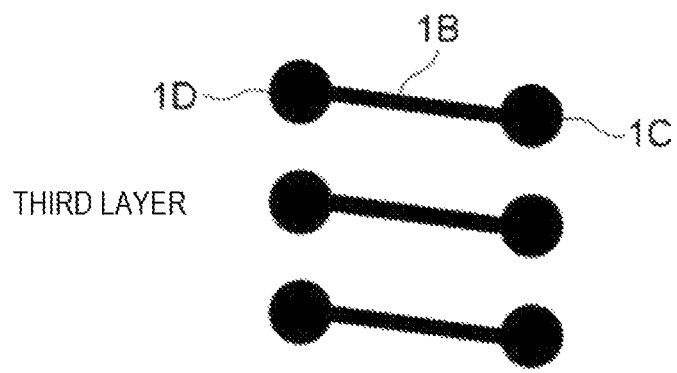
Figure 19C  THIRD LAYER

ROGOWSKI-TYPE CURRENT SENSOR AND INVERTER, AND METHOD OF MOUNTING ROGOWSKI-TYPE CURRENT SENSOR

TECHNICAL FIELD

The present invention relates to a Rogowski-type current sensor and an inverter that measure current distribution, and a method of mounting the Rogowski-type current sensor.

BACKGROUND ART

As a sensor for detecting the magnitude of a current, a CT (current transformer) is used to detect a current passing through a center of an iron core by winding a coil around a ring-shaped iron core, but has drawbacks that the size cannot be made smaller from the use of the iron core and that magnetic saturation causes large errors in measuring large currents. On the other hand, since a current sensor using a Rogowski coil has a hollow core, there are advantages that no magnetic saturation is caused and the size can be made smaller. The Rogowski-type current sensor is considered to be suitable for power devices such as IGBTs which are becoming more highly integrated and have large currents.

The Rogowski-type current sensor detects a current in a manner that a measuring portion, in which a Rogowski coil is formed, bends in an annular shape to surround a wiring as a measurement target. As such a Rogowski-type current sensor, there are known Rogowski-type current sensors disclosed in Patent Literatures 1 to 4.

A conventional Rogowski-type current sensor disclosed in Patent Literature 1 is provided with a notch in a non-wiring portion of an annular four-layer laminated printed wiring board (annular board), on which a Rogowski coil is formed, to insert a circuit to be measured into a hole of the annular board.

Further, conventional Rogowski-type current sensors disclosed in Patent Literatures 2 to 4 are configured to detect a current flowing through a measurement target in a state where a distal end portion of a sensor cable is inserted into an insertion port formed in a holding portion, to which a proximal end portion of the sensor cable configured to detect the current flowing through the measurement target, and surrounds the measurement target.

CITATION LIST

Patent Literature

Patent Literature 1: Japanese Patent No. 6709918
Patent Literature 2: Japanese Patent Laid-Open No. 2020-076706
Patent Literature 3: Japanese Patent Laid-Open No. 2020-076707
Patent Literature 4: Japanese Patent Laid-Open No. 2019-196962

SUMMARY OF INVENTION

Technical Problem

In the conventional Rogowski-type current sensor disclosed in Patent Literature 1, the printed wiring board deviates in a thickness direction from a position of the notch during measurement of a current flowing through an electric wire to form a clearance, and an wiring is inserted into a hole of the printed wiring board from the position of the notch. However, with a rigid printed wiring board, it is difficult to form a clearance by deviating in the thickness direction and insert it into the hole of the printed wiring board to flexibly surround the electric wire.

In the conventional Rogowski-type current sensors disclosed in Patent Literatures 2 to 4, a Rogowski coil in which a conductive wire is spirally wound around a hollow flexible member made of synthetic resin such as vinyl chloride or polyethylene is covered with a resin material such as fluorine resin.

Therefore, according to the conventional Rogowski-type current sensors disclosed in Patent Literatures 2 to 4, when measurement is repeated, the hollow flexible member may be damaged, and the spirally wound Rogowski coil may be damaged. In addition, since the hollow flexible member has a certain thickness, it becomes difficult to insert the sensor cable when a clearance between wirings is narrow.

Accordingly, an object of the present invention is to provide a Rogowski-type current sensor and an inverter capable of being flexibly deformed and easily mounted even when a clearance is narrow, and a method of mounting the Rogowski-type current sensor.

Solution to Problem

A Rogowski-type current sensor of the present invention is characterized by including a main body formed from a belt-shaped flexible wiring board and capable of surrounding a current path of a measurement target, the main body including a measuring portion in which a Rogowski coil is formed in a length direction by a conductive pattern.

According to the Rogowski-type current sensor of the present invention, since the main body is formed of the flexible wiring board, the main body can be bent and flexibly and repeatedly deformed even when surrounding the current path of the measurement target. Further, since the belt-shaped flexible wiring board is formed thin, the main body can be inserted even into a space having a narrow clearance, and can be wound around the measurement target such as a wiring.

The main body may be formed with an alignment portion capable of allowing a proximal end portion and a distal end portion of the Rogowski coil to be overlaid with each other when surrounding the current path of the measurement target.

When the main body surrounds the measurement target, the proximal end portion and the distal end portion of the Rogowski coil can be overlaid with each other by the alignment portion. For this reason, the Rogowski coil can accurately output a signal corresponding to the current of the wiring.

A grid-like mesh formed by a conductive pattern and intersecting in the length direction may be formed on a pair of layers with the Rogowski coil interposed therebetween.

When the main body is bent, the rigidity can be reduced compared with a case where a metal wire extends in the length direction, whereby a shield layer blocks an influence of an electric field change due to a voltage fluctuation of the measurement target, and a force required to bend the main body can be reduced.

A flexible portion (shield layer-removed portion) may be formed closer to a distal side than the measuring portion in the length direction of the main body at a distal end portion of the main body.

Since the rigidity of the flexible wiring board can be reduced when the flexible portion is formed at the distal end portion, the distal end portion can be easily bent.

The Rogowski coil may be configured in which a plurality of coils constituting the Rogowski coil are continuously connected along a closed line formed when surrounding the current path of the measurement target, by a forward line parallel to the closed line, between an end of winding of any coil and a start of winding of a next coil among coils adjacent to each other, and has a backward line parallel to the closed line from an end of winding of a last coil of the plurality of coils toward a start of winding of a first coil, the coil may be formed from a first side having an end of winding of the coil and a start of winding of the next coil, a second side located on a side opposite to the first side, and a third side and a fourth side connecting both end portions of the first side and the second side, one side of the third side and the fourth side may be a plane including the other side, and may be formed at a position deviating from a plane orthogonal to the closed line, and when a value indicating a coil pitch between the coils is defined as Wp, a value indicating an amount of deviation between the third side and the fourth side is defined as Ws, a value indicating a height from a second side to the first side is defined as T1, and a value indicating a height from the backward line to the first side is defined as T2, a relationship of $0<Ws<2\times Wp\times T2/T1$ may be satisfied.

When the amount of deviation Ws is greater than 0, a plane surrounded by the first side, the second side, the third side, and the fourth side appears and is formed. For this reason, a normal vector is generated by the plane, whereby it is possible to reduce the influence of a magnetic flux passing through the plane interposed between the forward line and the backward line between the coil pitches. Further, when the amount of deviation Ws is equal to or greater than $2\times Wp\times T2/T1$, an area of $Ws\times T1$ becomes too large, and the influence on the magnetic flux becomes worse compared with the case where the amount of deviation Ws is 0.

Therefore, in order to reduce an adverse influence of the magnetic flux due to the plane formed by $Wp\times T2$, a relationship of $0<Ws<2\times Wp\times T2/T1$ can be established.

The flexible wiring board may include at least three conductive pattern layers, each of the coils may be formed from a first coil pattern that is formed on a first layer and is the first side to which the forward line and the forward line are connected, a second coil pattern that is formed on a third layer and is the second side parallel to the first coil pattern, and a pair of through holes that are the third side and the fourth side connecting an end portion of the first coil pattern and an end portion of the second coil pattern, and the forward line may be formed on a second layer between the first layer and the third layer.

As described above, the Rogowski coil of the present invention can be composed of the flexible wiring board having at least three conductive pattern layers.

The amount of deviation Ws and the coil pitch Wp may have a relationship of $Ws\times T1=Wp\times T2$.

The normal vector due to the plane formed by $Wp\times T2$ is canceled by an opposite normal vector due to the plane formed by $Ws\times T1$. Therefore, the Rogowski-type current sensor can reduce the occurrence in noise, and thus the current can be measured accurately.

The main body may be formed with a signal takeout pad at the proximal end portion, and a connection pattern connected to the first coil and a connection pattern connected to the backward line may be formed at an overlaying position in a thickness direction.

When viewed in the thickness direction, a loop area can be reduced, whereby a parasitic inductance can be reduced and noise resistance can be improved.

The first coil pattern may be formed in a direction orthogonal to the closed line, the backward line may be formed parallel to the closed line, and the second coil pattern may be formed in a crank shape in which a pair of patterns extending in the direction orthogonal to the closed line from both end portions are connected to each other by a pattern formed in parallel with the closed line. Thus, when the Rogowski coil is viewed in the thickness direction (from above), the plane of the coil cannot be seen, and thus noise resistance can be improved.

When the main body surrounds the current path of the measurement target and the proximal end portion and the distal end portion of the Rogowski coil face each other, the proximal end portion and the distal end portion may not be in contact with each other, and the proximal end portion and the distal end portion of the Rogowski coil may be formed at the same position or close to each other.

A gap in the thickness direction when the proximal end portion and the distal end portion of the Rogowski coil face each other may be 1 mm or less. In addition, a gap in the length direction when the proximal end portion and the distal end portion of the Rogowski coil face each other may be ±1 mm or less.

Thus, it is possible to accurately measure the current flowing through the current path of the measurement target.

A fixture may be provided to fix the proximal end portion and the distal end portion of the Rogowski coil in an overlaying state when the main body surrounds the current path of the measurement target.

Thereby, it is possible to prevent the proximal end portion and the distal end portion of the Rogowski coil from deviating from the overlaid state during measurement of a current of the measurement target.

The main body may be formed with a fitted portion including a concave portion, a penetration hole, or a convex portion at either one of the proximal end portion and the distal end portion of the main body, the fixture may be formed with an insertion hole into which the one of the proximal end portion and the distal end portion is inserted to be capable of being overlaid with the other, a fitting portion may be formed on an inner wall of the insertion hole, the fitting portion including a convex portion fitting into the concave portion or the penetration hole of the fitted portion, or a concave portion or a penetration hole fitting into the convex portion of the fitted portion, and the proximal end portion and the distal end portion of the Rogowski coil may be overlaid with each other when the fitting portion is fitted into the fitted portion.

Since the fitted portion and the fitting portion function as alignment portions, the proximal end portion and the distal end portion of the Rogowski coil can be reliably overlaid with each other, and the distal end portion and the proximal end portion of the main body can be fixed in an overlaid state.

The fixture may be formed with an insertion hole into which either one of the proximal end portion and the distal end portion is inserted to be capable of being overlaid with the other, and the insertion hole may be formed with an abutment portion that stops insertion at a position where the proximal end portion and the distal end portion of the Rogowski coil are overlaid with each other when the one of the proximal end portion and the distal end portion is inserted.

When either one of the proximal end portion or the distal end portion of the main body is inserted into the insertion hole, such insertion is stopped by the abutment portion, and thus proximal end portion and the distal end portion of the Rogowski coil can be fixed in the overlaid state.

An inverter of the present invention is characterized by including: the Rogowski-type current sensor of the present invention; and a current measuring circuit that uses an output from the Rogowski-type current sensor that winds either one or both of an upper arm and a lower arm as the current paths connected in series between one power supply line and the other power supply line from a power supply, and measures a current flowing in the current paths.

When the Rogowski-type current sensor of the present invention is attached to the upper arm or the lower arm in this way, it is possible to monitor the current flowing in the upper arm or the lower arm to control the output current of the inverter, or to detect an excessive current flowing in the upper arm or the lower arm, and issue an alarm.

In addition, a method of mounting a Rogowski-type current sensor on a current path of a measurement target, the Rogowski-type current sensor including a belt-shaped flexible main body having a first main surface, a second main surface opposite to the first main surface, and a pair of side surfaces and a Rogowski coil embedded in the main body, the method is characterized by including mounting, on the current path of the measurement target, the Rogowski-type current sensor surrounding the current path of the measurement target such that one of the first main surface and the second main surface is an inner side.

In this way, the Rogowski-type current sensor of the present invention can be mounted to the current line.

A linear body may be directly or indirectly coupled to one end portion of the Rogowski-type current sensor, the linear body may be inserted into a clearance between the current path of the measurement target and another member, and then the linear body may be moved to wind and mount the Rogowski-type current sensor on the current path of the measurement target.

Thus, even when there is a narrow clearance between the current path of the measurement target and another member, first, the linear body directly or indirectly coupled to the end portion of the Rogowski-type current sensor is inserted into the clearance to pull the Rogowski-type current sensor through the clearance, and the Rogowski-type current sensor is located in the clearance, whereby the Rogowski-type current sensor can be easily mounted on the current path of the measurement target.

In addition, the present invention is a method of mounting a Rogowski-type current sensor including a main body formed from a belt-shaped flexible wiring board and having a measuring portion in which a Rogowski coil is formed in a length direction by a conductive pattern, the method comprising surrounding and mounting the Rogowski-type current sensor on a current path of a measurement target, using mark portions formed on both end portion of the Rogowski-type current sensor as guides. Thus, it is possible to facilitate mounting and reduce variations in characteristics.

Advantageous Effects of Invention

According to the Rogowski-type current sensor of the present invention, since the belt-shaped flexible wiring board is formed thin, the main body can be inserted even into a space having a narrow clearance, and can be wound around the measurement target such as a wiring, whereby it is possible to flexibly deform and easily mount the sensor even when a clearance is narrow.

BRIEF DESCRIPTION OF DRAWINGS

FIGS. 1A and 1B are perspective views showing states in which a Rogowski-type current sensor according to an embodiment of the present invention is wound around a current path, wherein FIG. 1A is a view showing a state in which front surfaces (first main surfaces) of a main body are overlaid with each other, and FIG. 1B is a view showing a state in which a front surface (first main surface) of a distal end portion and a back surface (second main surface) of a proximal end portion are overlaid with each other.

FIGS. 4A and 4B are views for explaining a shield layer of the flexible wiring board shown in FIG. 2A, wherein FIG. 4A is a view of a front shield layer, FIG. 4B is a view of a back shield layer.

FIG. 7A is a view for explaining a third layer of the flexible wiring board shown in FIG. 2A, and FIG. 7B is a partially enlarged view of FIG. 7A.

FIG. 8 is a view for explaining a configuration of the flexible wiring board shown in FIG. 2A.

FIGS. 9A and 9B are views showing states in which the proximal end portion and the distal end portion of the Rogowski coil of the Rogowski-type current sensor shown in FIG. 1A or 1B are overlaid, wherein FIG. 9A is a view for explaining a gap in a thickness direction, and FIG. 9B is a view for explaining a gap in a length direction.

FIGS. 11A and 11B are views of examples in which the Rogowski-type current sensor shown in FIG. 1A or 1B is fixed by alignment of the Rogowski coil, wherein FIG. 11A is a view when the distal end portion is inserted into the housing through which the proximal end portion of the main body penetrates, and FIG. 11B is a view showing a state in which the distal end portion of the main body is inserted into an insertion hole of the housing shown in FIG. 11A.

FIGS. 12A, 12B, and 12C are views of examples in which the Rogowski-type current sensor shown in FIG. 1A or 1B is fixed by alignment of the Rogowski coil, wherein FIG. 12A is a view when the distal end portion is inserted into the housing through which the proximal end portion of the main body penetrates, and FIG. 12B is a view showing a state in which the distal end portion of the main body is inserted into the insertion hole of the housing shown in FIG. 12A.

FIGS. 14A, 14B, and 14C are views for explaining patterns of the Rogowski coil shown in FIG. 3, wherein FIG. 14A is a view for explaining a first coil pattern of a first layer, FIG. 14B is a view for explaining a through hole of a second layer, and FIG. 14C is a view for explaining a second coil pattern of a third layer.

FIGS. 19A, 19B, and 19C are views for explaining modification examples of the Rogowski coil, wherein FIG. 19A is a view for explaining a first coil pattern of a first layer, FIG. 19B is a view for explaining a through hole of a second layer, and FIG. 19C is a view for explaining a second coil pattern of a third layer.

DESCRIPTION OF EMBODIMENTS

A Rogowski-type current sensor according to an embodiment of the present invention will be described with reference to the drawings.

Figure 1A:
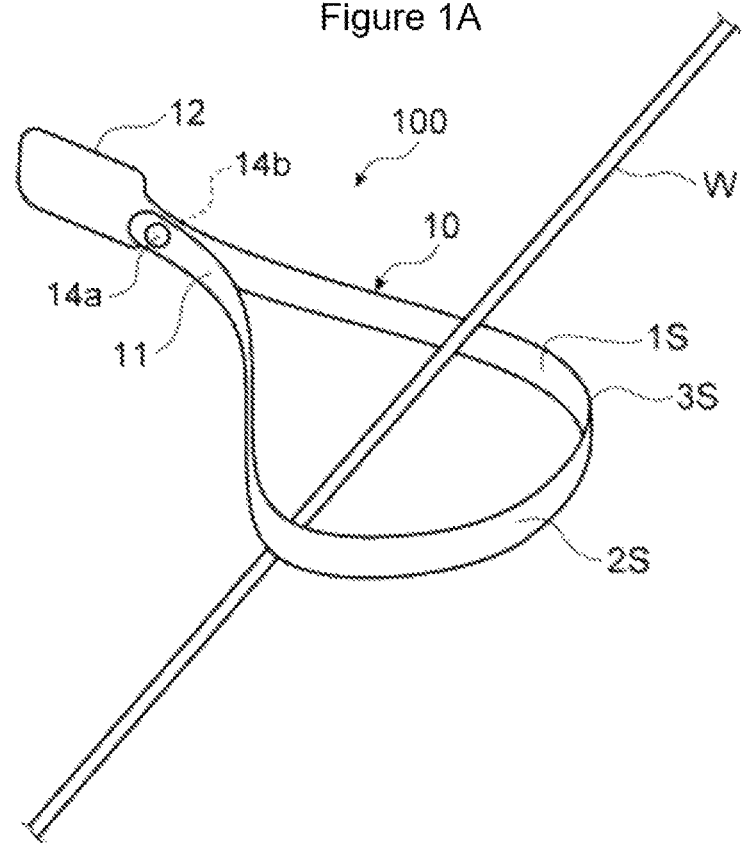
Figure 1B:
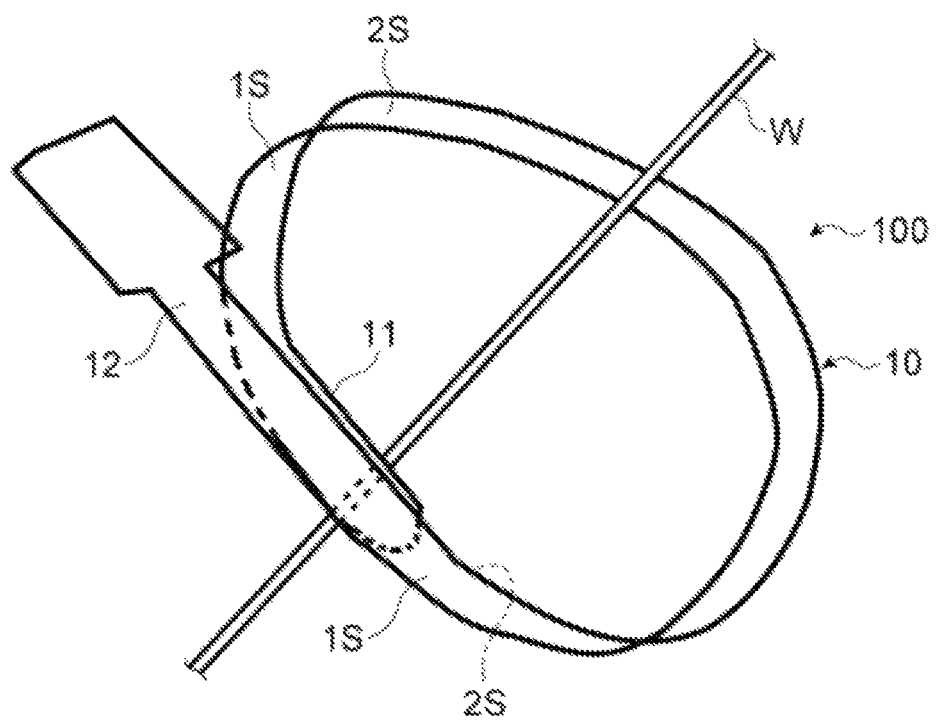

A Rogowski-type current sensors 100 shown in FIGS. 1A and 1B is configured to surround a wiring W (current path) as a measurement target and to measure a current flowing through the wiring W. When the Rogowski-type current sensor 100 surrounds the wiring W, front surfaces (first main surfaces 1S) can be overlaid with each other as shown in FIG. 1A or a front surface (first main surface 1S) of a distal end portion 11 and a back surface (second main surface 2S) of a proximal end portion 12 can be overlaid with each other as shown in FIG. 1B. The Rogowski-type current sensors 100 shown in FIGS. 1A and 1B can be used properly depending on specifications or usage environments of devices or modules to be attached.

In addition, although not shown, the back surfaces (second main surfaces 2S) can be overlaid with each other, and the back surface (second main surface 2S) of the distal end portion 11 and the front surface (first main surface 1S) of the proximal end portion 12 can be overlaid with each other.

Figure 2A:
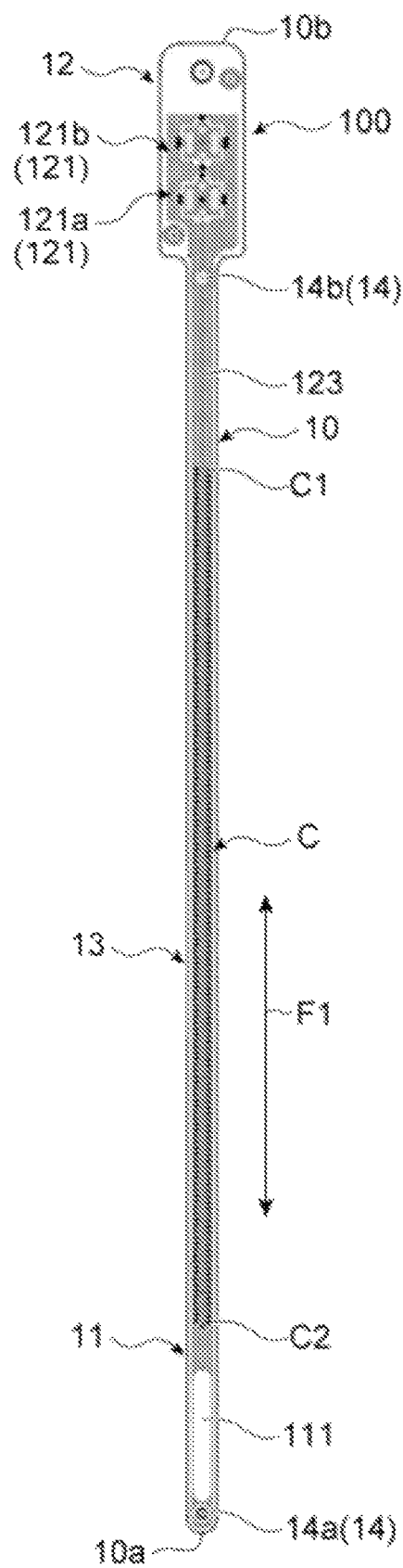
FIG. 2A is a view of a flexible arrangement board constituting the Rogowski-type current sensor shown in FIG. 1A or 1B.

The Rogowski-type current sensor 100 shown in FIG. 2A includes a main body 10 formed from a belt-shaped flexible wiring board.

The main body 10 is a flexible five-layer board (see FIG. 8, first to third layers and two shied layers) in which resin films and conductive patterns are alternately arranged. The main body 10 is formed in a linear shape in an initial state.

The main body 10 is formed to have a length of about 10 cm from a distal end 10a to a proximal end 10b. Further, the main body 10 is formed in which a narrow width portion on the distal end 10a has about 2 mm and a wide width portion on the proximal end 10b has about 6 mm.

The main body 10 includes the distal end portion 11 formed with an elongated hole 111 functioning as a flexible portion in a length direction F1, the proximal end portion 12 formed with a soldering pad 121 (terminal portion), on which a connection plug is mounted, and having a width wider than that of the distal end portion 11, and a measuring portion 13 located between the distal end portion 11 and the proximal end portion 12 and formed with a Rogowski coil C.

Further, a first alignment portion 14a, which is one side of an alignment portion 14 (mark portion), is formed in front of the elongated hole 111 formed in the distal end portion 11 by a pad, the alignment portion 14 being used for overlaying a proximal end portion C1 and a distal end portion C2 of the Rogowski coil C when the main body 10 is bent into an annular shape to surround the wiring. In addition, a second alignment portion 14b, which is the other side of the alignment portion 14, is formed on the proximal end portion 12 by a pad.

Figure 2B:
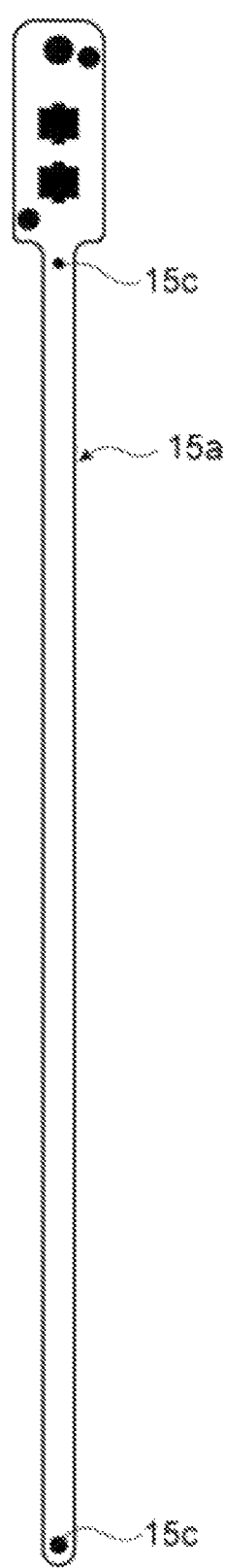
FIG. 2B is a view for explaining a cover film arranged on a front (first main surface) side of a flexible wiring board.
Figure 2C:
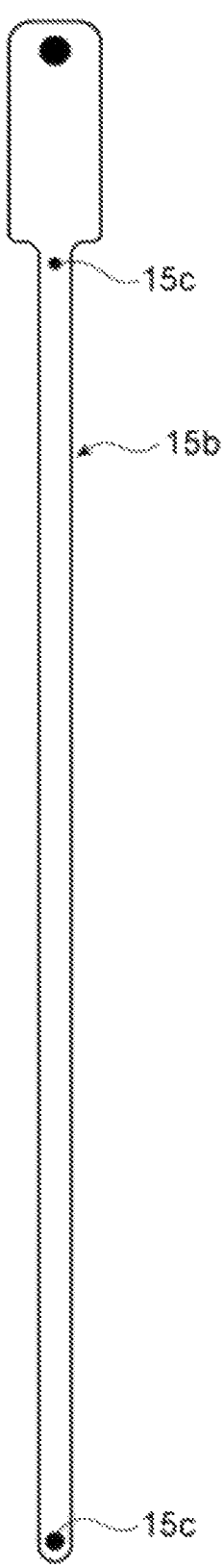
FIG. 2C is a view for explaining a cover film arranged on a back (second main surface) side of the flexible wiring board.

The alignment portion 14 is exposed to the outside through penetration holes 15c formed in cover films 15a and 15b, which are front and back surface layers shown in FIGS. 2B and 2C.

In this way, the alignment portions 14 (mark portions) are formed at both end portions of the Rogowski-type current sensor.

The soldering pad 121 shown in FIG. 2A includes a first pad 121a (signal takeout pad) for outputting a signal from the Rogowski coil C and a second pad 121b connected to a shield layer, which will be described below, and dropped to the ground.

The first pad 121a is connected to a forward line and a backward line of the Rogowski coil C by a pair of connection patterns 123.

The Rogowski coil C formed in the measuring portion 13 will be described below.

Figure 3:
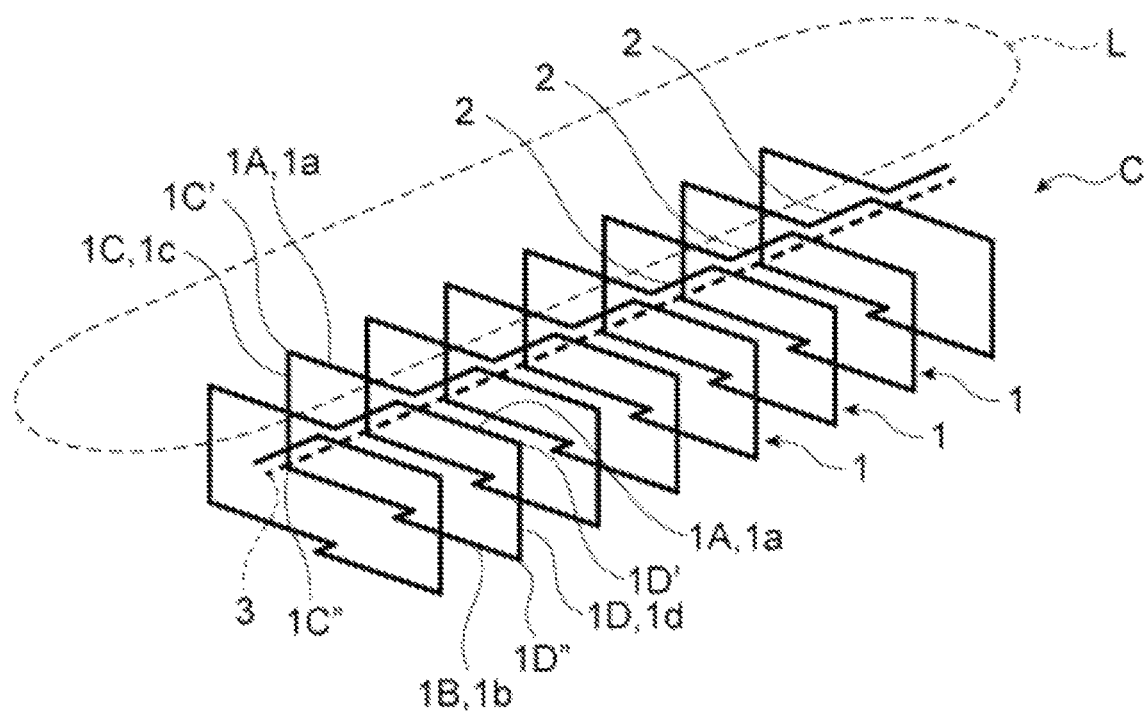
FIG. 3 is a view for explaining a principle of a Rogowski coil formed on the flexible wiring board shown in FIG. 2A.

As shown in FIG. 2A, in the Rogowski coil C, coils 1 constituting a plurality of coils (Rogowski coils C) are continuously connected along a closed line L shown in FIG. 3 formed when the proximal end portion C1 and the distal end portion C2 of the Rogowski coil C are overlaid with each other, by a forward line 2 parallel to the closed line L, between an end of winding of any coil and a start of winding of the next coil among coils adjacent to each other.

Further, the Rogowski coil C has a backward line 3 parallel to the closed line L from an end of winding of a last coil of a plurality of coils toward a start of winding of a first coil.

The backward line 3 is arranged closer to the forward line 2 than a coil portion located on a side opposite to the forward line 2.

The Rogowski coil C is formed by a conductive pattern due to the flexible wiring board of the main body 10 (measuring portion 13) shown in FIG. 2A. The flexible wiring board having at least three conductive pattern layers can be used.

First, shield layers S (see FIGS. 4A and 4B), which are a pair of layers with the Rogowski coil C interposed therebetween in the thickness direction, are formed on an inner layer side of the cover film 15a shown in FIG. 2B serving as the first main surface and on an inner layer side of the cover film 15b shown in FIG. 2C serving as the second main surface opposite to the first main surface, the cover films being surface layers of the main body 10. As shown in FIG. 4C, the shield layer S is formed with a grid-like mesh S1 intersecting in the length direction F1. In the present embodiment, the mesh S1 is inclined at 45 degrees relative to the length direction F1.

Figure 4A:
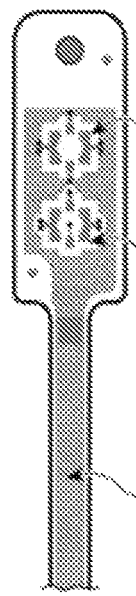
Figure 4B:
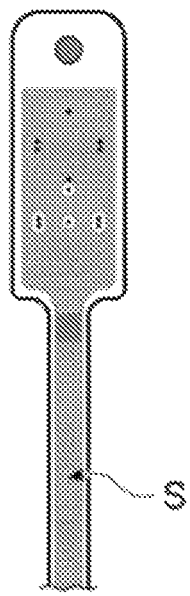
Figure 4C:
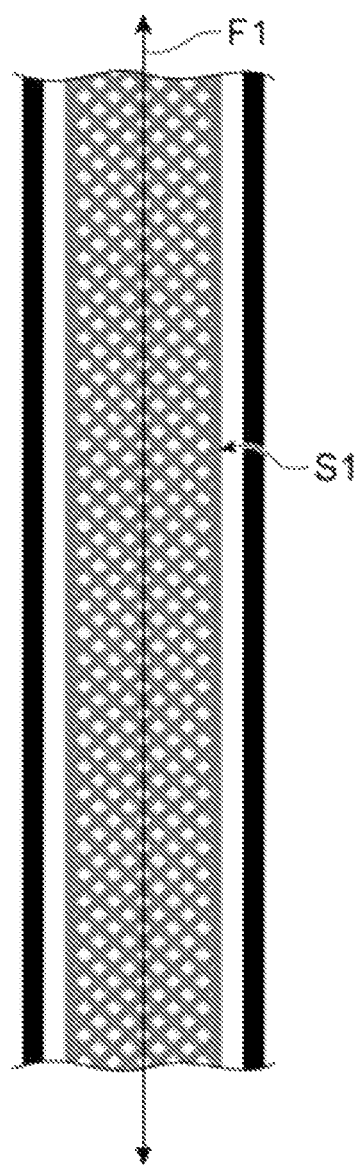
FIG. 4C is a partially enlarged view of a mesh of the shield layer.

Further, as shown in FIG. 4A, the shield layer S is formed with the soldering pad 121 described above.

Figure 5A:
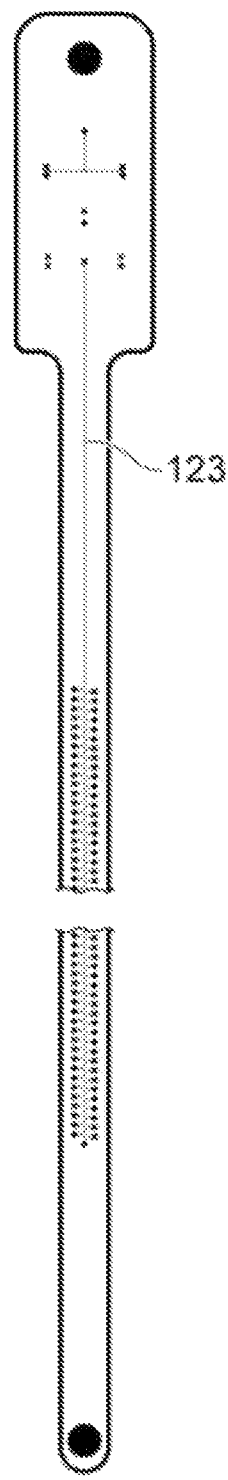
FIG. 5A is a view for explaining a first layer of the flexible wiring board shown in FIG. 2A.
Figure 5B:
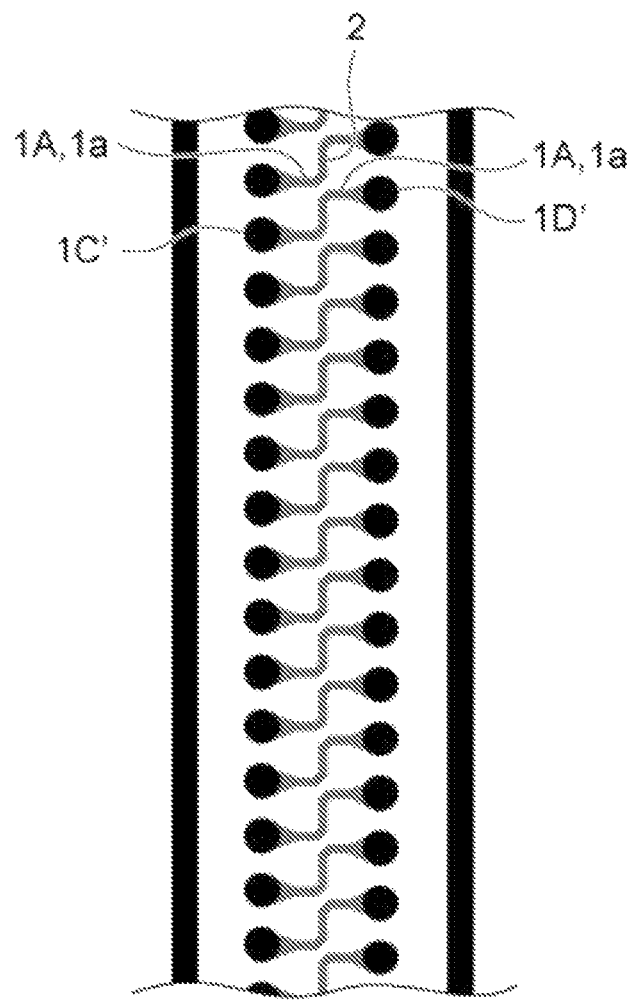
FIG. 5B is a partially enlarged view of FIG. 5A.

In the inner layer of the pair of shield layers S, as a first layer (see FIG. 8), as shown in FIGS. 3, 5A, and 5B, a first coil pattern 1A (first side 1a), connection portions 1C' and 1D' serving as one end portions of the through hole connected to the first coil pattern 1A, the forward line 2, and the connection pattern 123 are formed.

Figure 6A:
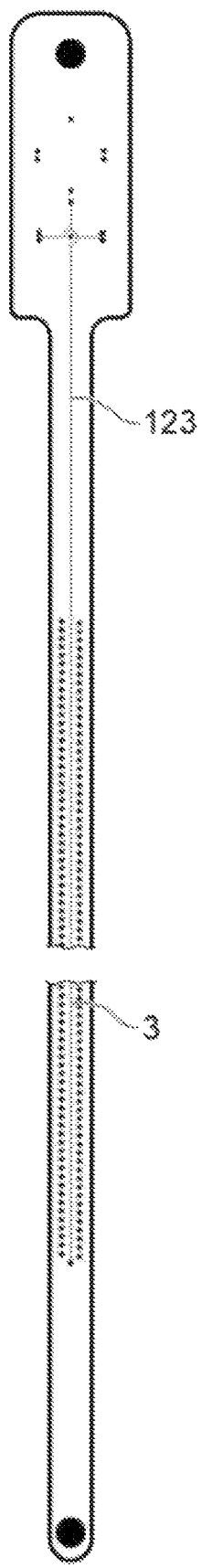
FIG. 6A is a view for explaining a second layer of the flexible wiring board shown in FIG. 2A.
Figure 6B:
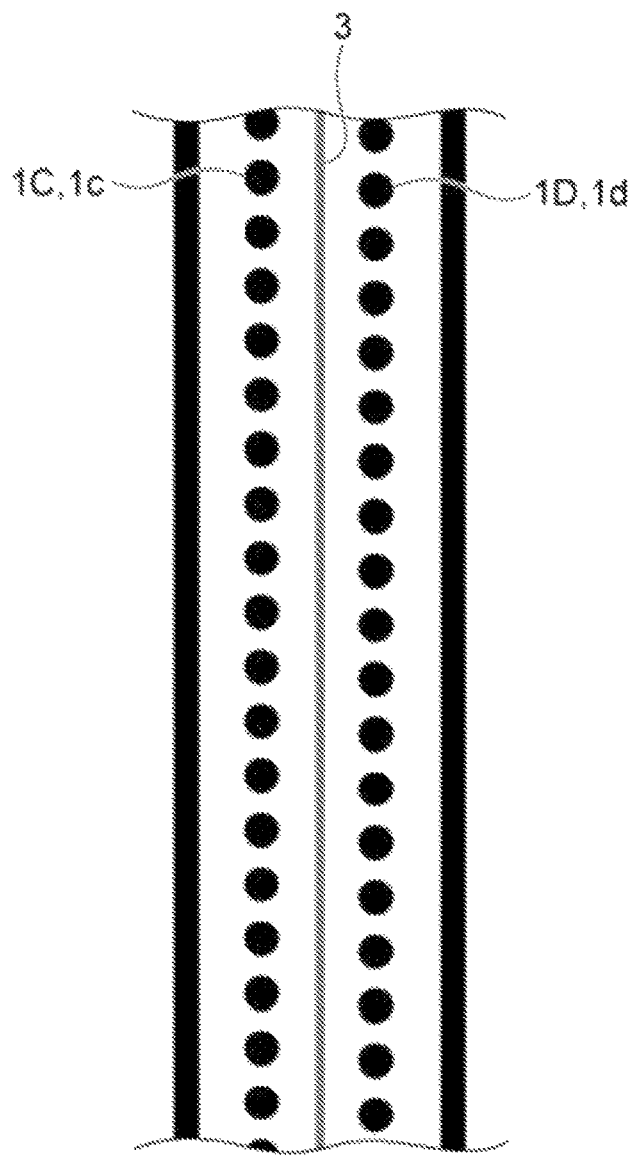
FIG. 6B is a partially enlarged view of FIG. 6A.

Further, as a second layer (see FIG. 8) inside the pair of shield layers S, as shown in FIGS. 3, 6A, and 6B, through holes 1C and 1D (third side 1c and fourth side 1d) connecting between the first coil pattern 1A and a second coil pattern 1B, which will be described below, and the backward line 3 are formed.

Further, as a space layer laminated on the second layer, a layer is provided in which no pattern is formed.

Further, as a third layer (see FIG. 8) laminated on the space layer, as shown in FIGS. 3, 7A, and 7B, the second coil pattern 1B (second side 1b) and connection portions 1C" and 1D" serving as the other end portions of the through hole connected to the second coil pattern 1B are formed.

When the flexible wiring board is formed in this way, a space between the forward line 2 serving as the first layer and the backward line 3 serving as the second layer is formed to be 37.5 by a base film (12.5 μm) and a bonding sheet (25 μm). A space between the backward line 3 serving as the second layer and the second coil pattern 1B serving as a third layer, which is a coil portion on the side opposite to the forward line 2 is formed to be 125 μm by a base film (50 μm), a bonding sheet (25 μm), and a base film (50 μm).

In this way, the forward line 2 and the backward line 3 coincide in path with each other when viewed from above, and are different only in height, and the backward line 3 is wired closer to the forward line 2 than the second coil pattern 1B (second side 1b).

Figure 9A:
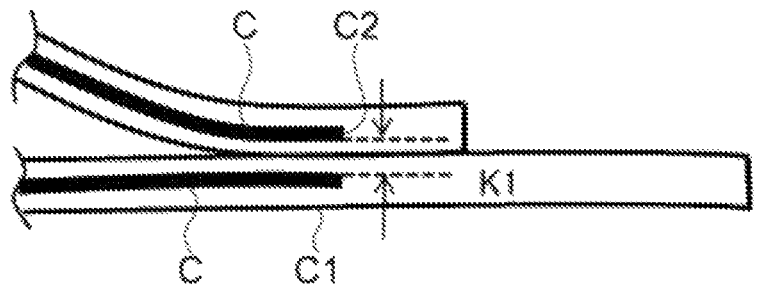

When the main body 10 of the Rogowski-type current sensor 100 surrounds the current path (wiring W) of the measurement target to measure a current, the proximal end portion C1 and the distal end portion C2 of the Rogowski coil C are not in contact with each other, and are at the same position or close to each other, as shown in FIG. 9A. At this time, a gap K1 can be made 1.5 mm or less, and preferably 1 mm or less in the thickness direction. In other words, since the Rogowski-type current sensor 100 is configured by laminating the Rogowski coil C with flexible resin films as described above, the Rogowski coil C is in a state in which at least both surfaces are interposed between the resin films or the like. At this time, when the proximal end portion C1 and the distal end portion C2 of the Rogowski coil C are overlaid with each other to form an annular shape, the proximal end portion C1 and the distal end portion C2 of the Rogowski coil C are separated by at least the thickness of the resin films, and thus can be in a non-contact state. When it is desired to adjust the gap K1, it is conceivable to insert a separate spacer, adjust an amount of adhesive to be applied, or cut the resin films.

Figure 9B:
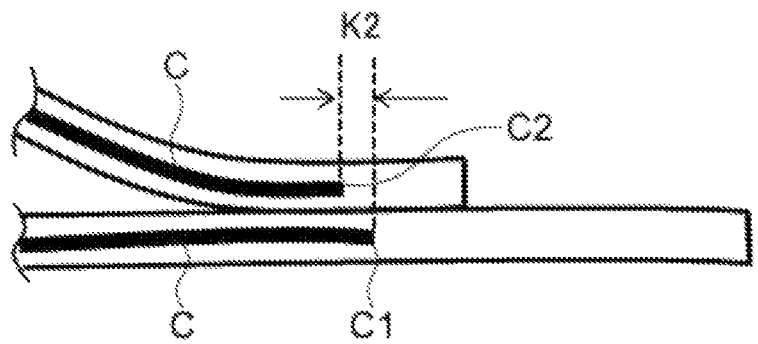

Further, as shown in FIG. 9B, a gap K2 can be made ±1.5 mm or less, and preferably ±1 mm or less in the length direction.

Furthermore, as shown in FIG. 1A, when the first alignment portion 14a and the second alignment portion 14b are fixed at an overlaid position, the proximal end portion C1 and the distal end portion C2 of the Rogowski coil C shown in FIG. 9B can be reliably at the same position or substantially the same position.

Figure 10:
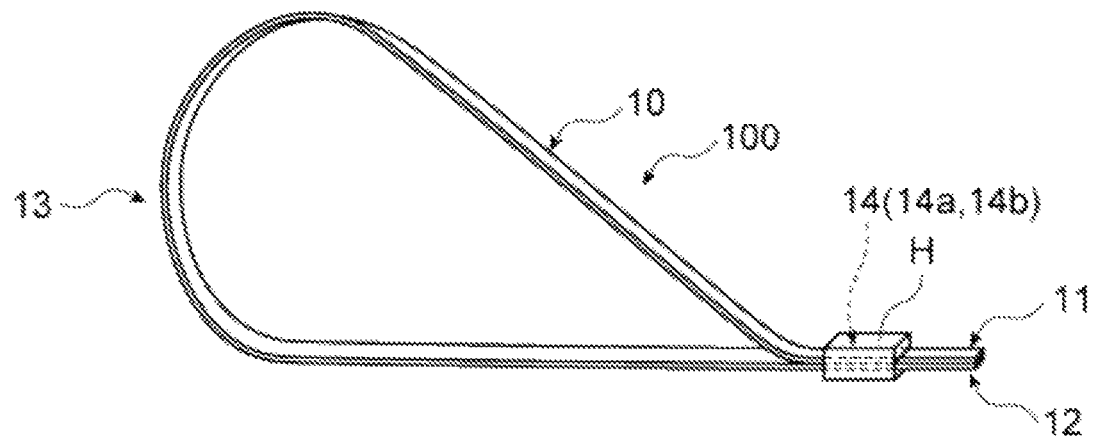
FIG. 10 is a view of an example in which the Rogowski-type current sensor shown in FIG. 1A or 1B is fixed by alignment of the Rogowski coil, and is a view of a state in which the proximal end portion and the distal end portion of the main body are fixed by a housing.

Such fixing may be performed by soldering, or winding an adhesive tape, and for example, as shown in FIG. 10, the distal end portion 11 and the proximal end portion 12 of the main body 10 of the overlaid alignment portion 14 may be sandwiched and held by a housing H as a metal fixture. Thereby, it is possible to prevent the proximal end portion C1 and the distal end portion C2 of the Rogowski coil C (see FIG. 9) from deviating from the overlaid state during measurement of a current of the measurement target. In addition, when the housing H is made of metal, it is possible to prevent external noise from mixing into the overlaid position.

Figure 11A:
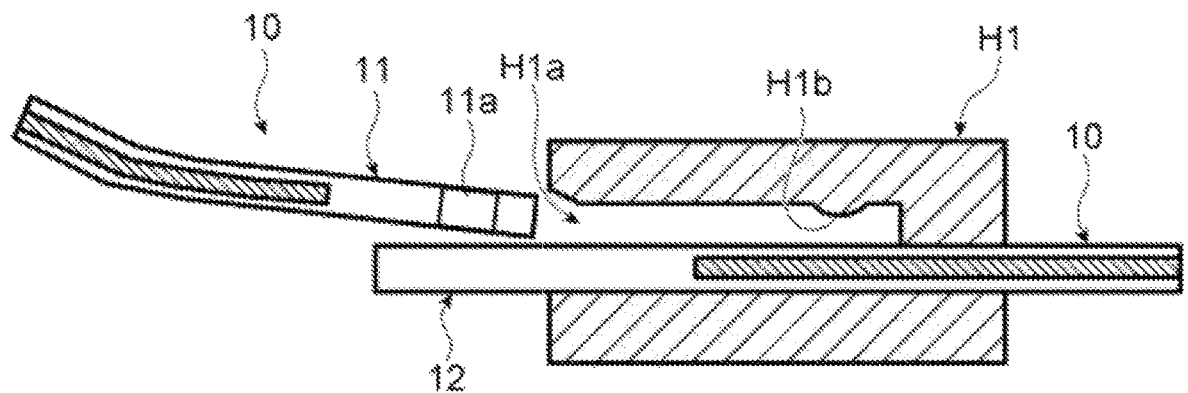

Moreover, the proximal end portion C1 and the distal end portion C2 of the Rogowski coil C can be fixed in an overlaid state even by a housing H1 (fixture) shown in FIG. 11A.

The housing H1 has a rectangular cylindrical shape with an insertion hole H1a formed in an insertion direction of the main body 10. In the housing H1, the main body 10 penetrates an innermost wall of the insertion hole H1a and extends to an opening of the insertion hole H1a, and the proximal end portion 12 protrudes from the insertion hole H1a.

The distal end portion 11 is overlaid with the proximal end portion 12 by being inserted into the insertion hole H1a.

In an example shown in FIG. 11A, a penetration hole 11a serving as a fitted portion is formed in the distal end portion 11 of the main body 10. Further, a convex portion H1b serving as a fitting portion is formed on an inner wall of the insertion hole H1a on the distal end portion 11 side.

Figure 11B:
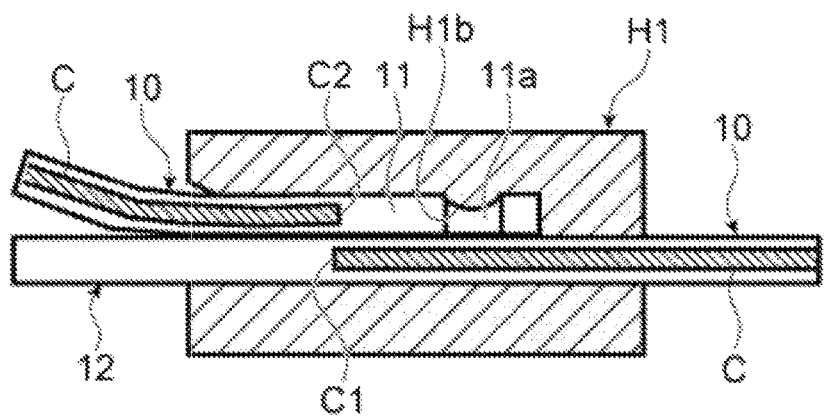

As shown in FIG. 11B, the distal end portion 11 of the main body 10 is inserted into the insertion hole H1a, and the convex portion H1b serving as the fitting portion fits into the penetration hole 11a serving as the fitted portion, whereby the proximal end portion C1 and the distal end portion C2 of the Rogowski coil C are overlaid with each other.

In this way, the penetration hole 11a serving as the fitted portion and the convex portion H1b serving as the fitting portion function as the alignment portions, whereby the proximal end portion C1 and the distal end portion C2 of the Rogowski coil C can be reliably overlaid with each other, and the distal end portion 11 and the proximal end portion 12 of the main body 10 can be fixed in an overlaid state.

In the example shown in FIGS. 11A and 11B, the proximal end portion 12 of the main body 10 penetrates the housing H1 from the beginning, but the distal end portion 11 is arranged in a state of being penetrated and the proximal end portion 12 may be inserted during measurement.

In addition, the distal end portion 11 can also be formed with a concave portion instead of the penetration hole 11a. Further, a convex portion can be used instead of the penetration hole 11a. When a convex portion is used instead of the penetration hole 11a, a penetration hole or a concave portion is formed in the inner wall of the insertion hole H1a, and thus the convex portion of the main body can be fitted into the concave portion of the housing H1.

Further, as shown in FIGS. 11A and 11B, it is possible to perform alignment by, for example, being brought an end surface of the distal end portion 11 of the Rogowski-type current sensor 100 into contact with an upper part of the innermost wall of the insertion hole H1a of the fixture H1 without providing the penetration hole 11a and the convex portion H1b.

Figure 12A:
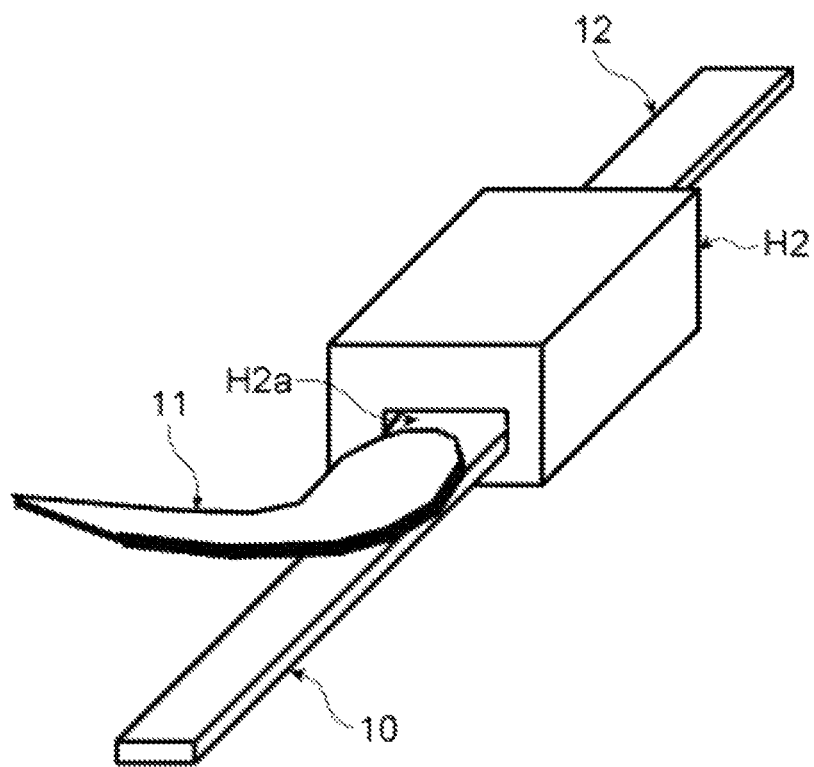
Figure 12B:
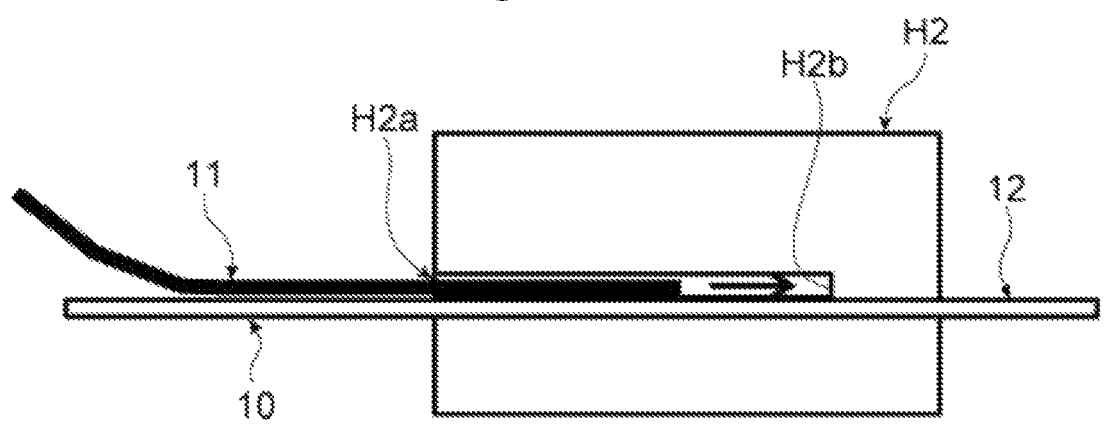

For example, a housing H2 shown in FIGS. 12A and 12B is formed with an insertion hole H2a used for overlaying with the proximal end portion 12 when the distal end portion 11 of the main body 10 is inserted.

In order to stop the insertion of the distal end portion 11 at a position where the proximal end portion and the distal end portion of the Rogowski coil are overlaid with each other, the insertion hole H2a is formed with an abutment portion H2b.

Since the housing H2 is formed in this way, when the distal end portion 11 of the main body 10 is inserted into the insertion hole H2a of the housing H2, the insertion is stopped by the abutment portion H2b, and the proximal end portion and the distal end portion of the Rogowski coil can be fixed in the overlaid state.

Even in the housing H2 shown in FIGS. 12A and 12B, the proximal end portion 12 of the main body 10 penetrates the fixture H2 from the beginning, but the distal end portion 11 is arranged in a state of being penetrated and the proximal end portion 12 may be inserted during measurement.

As shown in FIG. 2A, when the main body 10 is bent in the annular shape to surround the wiring as the measurement target, the proximal end portion C1 and the distal end portion C2 of the Rogowski coil C can be overlaid with each other by the alignment portion 14 (first alignment portion 14a, second alignment portion 14b). For this reason, the Rogowski-type current sensor 100 can cause the Rogowski coil C to accurately output a signal corresponding to the current of the wiring.

In addition, since the Rogowski-type current sensor 100 formed in this way has the main body 10 formed of the flexible wiring board, the main body 10 can be flexibly and repeatedly deformed even when being bent in the annular shape. Further, since the belt-shaped flexible wiring board is formed thin, the main body 10 can be inserted even into a space having a narrow clearance, and can be wound around the measurement target such as a wiring.

Therefore, the Rogowski-type current sensor 100 can be flexibly deformed and can be easily mounted even when the clearance is narrow.

In addition, since the proximal end portion 12 is formed wider than other portions, subsequent connection work of the wiring to each pad becomes easy. Furthermore, the proximal end portion 12 and the distal end portion 11 are easily distinguished in shape from each other, and workability of attachment of the Rogowski-type current sensor 100 is improved.

Even when the main body 10 is inserted into the space having a narrow clearance and bent, since rigidity is lowered by the elongated hole 111 formed in the distal end portion 11, the distal end portion 11 can be easily bent.

In the present embodiment, by the elongated hole 111, the distal end portion 11 is easily bent and the insertion of the distal end portion 11 into the clearance between the wirings is easy, but even when the penetrating elongated hole 111 is not provided, a portion corresponding to the elongated hole 111 may be made thinner than other portions (remove the shield layer S to make it thinner) to improve bendability, or the portion corresponding to the elongated hole 111 may be embedded with a material that is more flexible than the flexible wiring board. In other words, from the viewpoint that workability of the distal end portion 11 can also be improved, the flexible portion such as the elongated hole 111 is preferably provided closer to the distal end portion 11.

In the present embodiment, furthermore, the elongated hole 111 (flexible portion) is provided in order to improve an insertion property of the distal end portion 11 into the clearance, but since attachment performance can be improve by making the distal end portion 11 hard to bend depending on the design and usage environment, the portion corresponding to the elongated hole 111 may be made thicker than other portions to make it difficult to bend, or the portion corresponding to the elongated hole 111 may be embedded with a material (hard material) that is less flexible than the flexible wiring board.

As described above, since the flexible portion is provided closer to (in the vicinity of) the distal end portion 11 and the ease of bending of the distal end portion 11 can be adjusted, it is possible to realize ease of attachment when incorporating into modules and devices in various environments.

Further, the Rogowski coil C is interposed between the shield layers S on both sides in the thickness direction. Therefore, when the current is measured by the Rogowski-type current sensor 100, the shield layer S is interposed between the Rogowski coil C and the measurement target even when either one surface or the other surface of the main body 10 faces the measurement target. For this reason, the shield layer S can block the influence of an electric field generated by the measurement target.

In addition, since the shield layer S is formed of the meshes S1 intersecting in the length direction F1, the rigidity when the main body 10 is bent can be reduced compared with a case where a metal wire extends in the length direction F1. Therefore, a force required to bend the main body 10 can be reduced.

In order to maximize the effect of the shield layer S, as described above, it is preferable to provide the shield layer S over the entire surface on both main surfaces (first main surface and second main surface) so as to interpose the Rogowski coil C therebetween, but the shield layer S may be partially provided depending on the usage environment of the Rogowski-type current sensor. In other words, the shield layer S may be provided only near the center of the main body 10, or the shield layer S may not be arranged in the center of the main body 10 and the shield layer S may be divided and provided at both end portions of the main body 10. In addition, the shield layer S may not be provided on both main surfaces, but the shield layer S may be provided only on one main surface. When the shield layer S is partially provided in this way, characteristics can be improved compared to a case where the shield layer S is not provided.

Figure 13A:
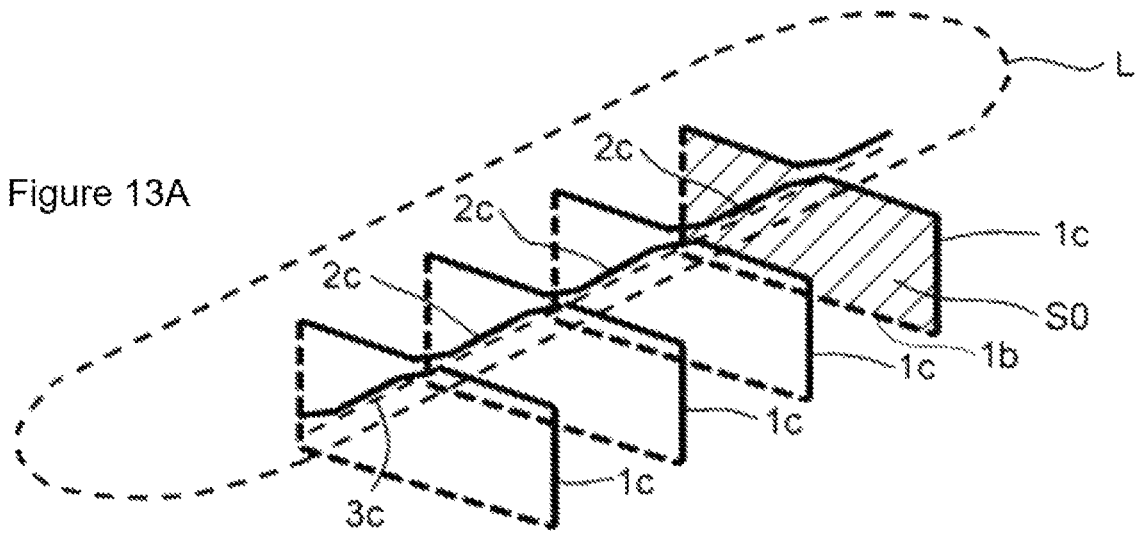
FIG. 13A is a view for explaining a principle of a conventional Rogowski coil.

For example, FIG. 13A shows the conventional Rogowski-type current sensor disclosed in Patent Literature 1.

The Rogowski coil of the Rogowski-type current sensor shown in FIG. 13A includes a plurality of rectangular coils 1c that are connected continuously to each other along one closed line L, each of the coils being formed on one plane S0 perpendicular to the closed line L. The coils 1 are connected to each other by a forward line 2c parallel to the closed line L. When the number of the plurality of coils 1c is n turns, a backward line 3c of one turn is provided from an end of winding of an n-turn-th coil 1c starting from a first-turn coil 1c to a start of winding of the first-turn coil 1 along the closed line L.

Figure 13B:
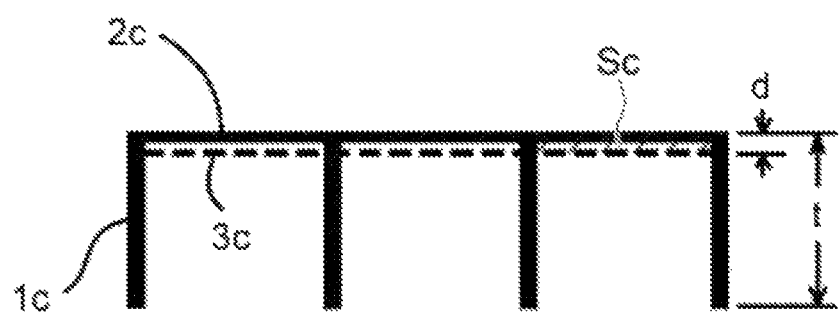
FIG. 13B is a schematic view of the conventional Rogowski coil as viewed from the thickness surface.

In this way, since the coils 1c are formed on the one plane S0 perpendicular to the closed line L, a current flowing through an electric line penetrating the inside of the coils 1c is detected, but a height d from the forward line 2c to the backward line 3c is set to be smaller than a thickness t of the coil as shown in FIG. 13B, whereby a current flowing outside the coils becomes negligible as a coil and noise can be reduced.

Such an effect can be obtained when the backward line 3 is wired closer to the forward line 2 than a second side 1b.

However, as shown in FIG. 13B, it is easy to set the height d between the forward line 2c and the backward line 3c to be smaller than the thickness t of the coil in a case of a thick printed wiring board, but since the thickness of the board is 300 or less in a case of a thin flexible wiring board, it is difficult to ensure a sufficient difference in height.

Therefore, when the conventional Rogowski coil is formed on the flexible wiring board, a magnetic flux passing through a plane Sc surrounded by the forward line 2c, the backward line 3c, and the height d is also affected, and a normal vector in the plane Sc is perpendicular to a normal vector in the plane S0. In the conventional Rogowski coil, therefore, the influence of the normal vector in the plane S0 and the normal vector in the plane Sc on the magnetic flux is a synthetic vector.

Figure 14A:
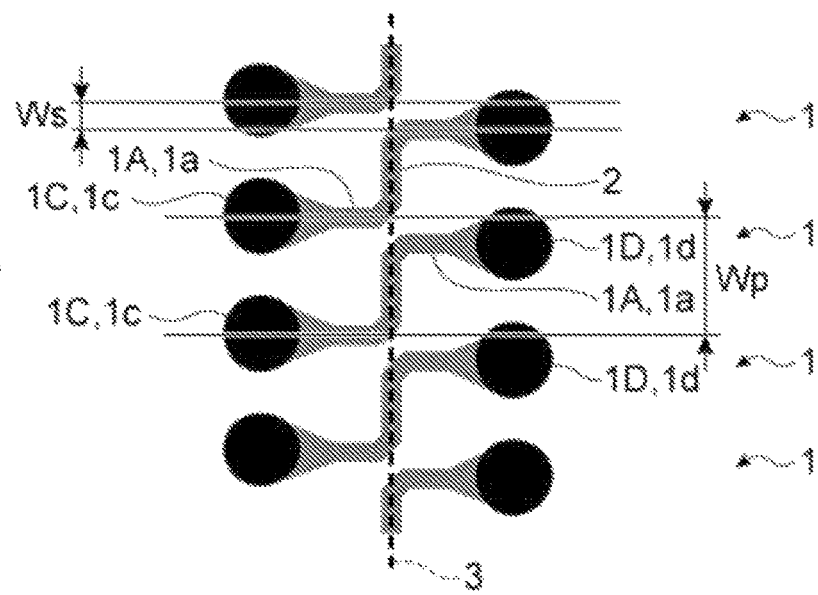
Figure 14B:
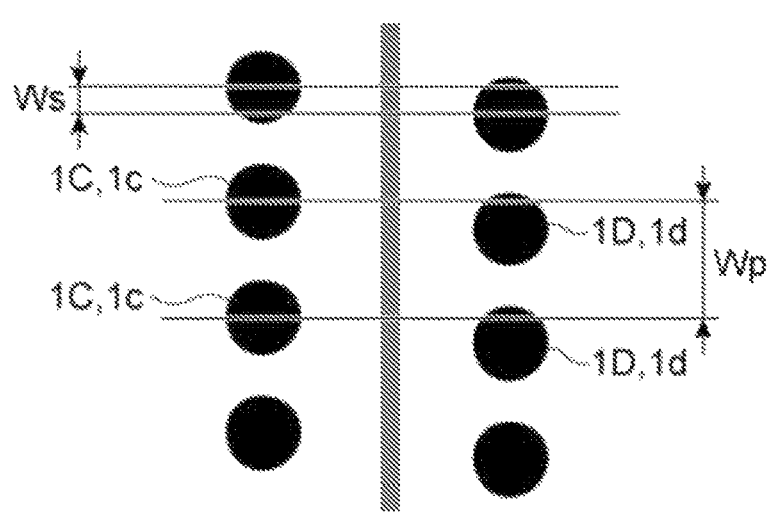
Figure 14C:
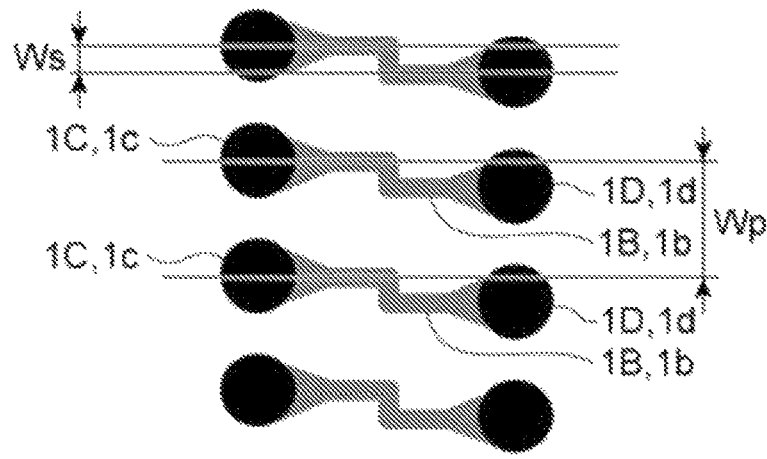
Figure 15:
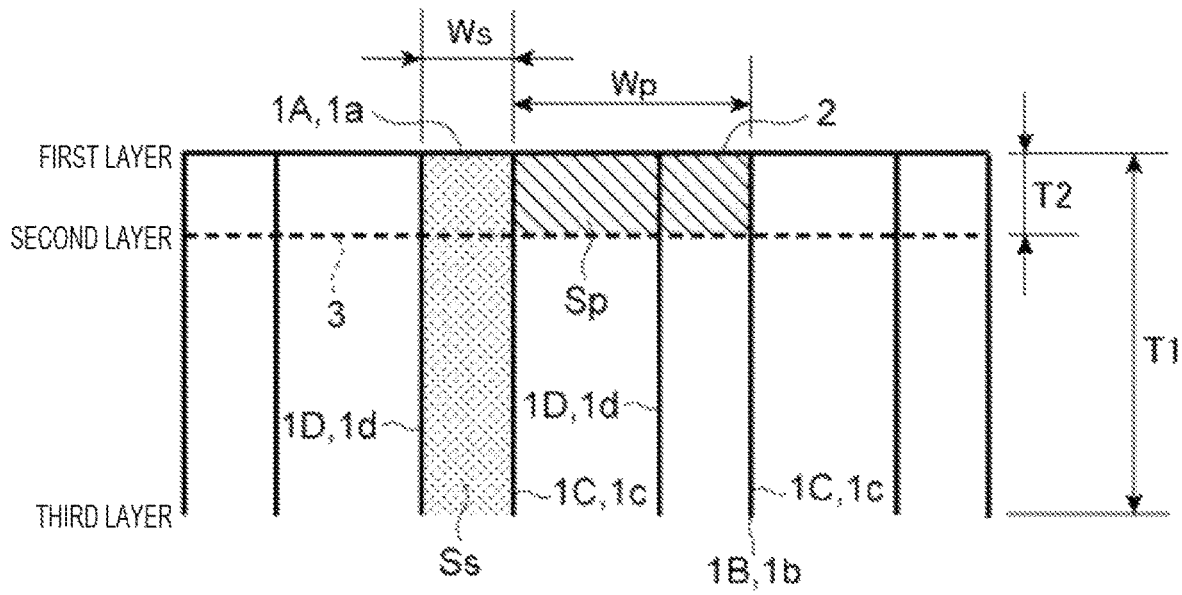
FIG. 15 is a schematic view of the Rogowski coil shown in FIG. 3 as viewed from a thickness surface.

Therefore, in the Rogowski coil C according to the present embodiment, as shown in FIGS. 14 and 15, through holes 1D are formed at positions deviating in an arrangement direction of the coils 1 from through holes 1C.

Specifically, when the flexible wiring board is viewed from a thickness surface of the main body 10 (flexible wiring board), a distance (coil pitch) between the through hole 1C (third side 1c) of the coil 1 and a through hole 1C (third side 1c) of the adjacent coil 1 is defined as Wp, an amount of deviation of the other through hole 1D (fourth side 1d) from one through hole 1C (third side 1c) of the coil 1 is defined as Ws, a height from a second coil pattern 1B (second side 1b) to a first coil pattern 1A (first side 1a) is defined as T1, and a height from the backward line 3 to the first coil pattern 1A (first side 1a) is defined as T2.

In such a case, the Rogowski coil C is formed so as to satisfy a relationship of $0<Ws<2\times Wp\times T2/T1$, and particularly, is formed so as to satisfy a relational expression of $Ws\times T1=Wp\times T2$ in the present embodiment.

Thereby, the influence on the magnetic flux is canceled by a normal vector in a plane Sp formed by $Wp\times T2$ and a normal vector in a plane Ss formed by $Ws\times T1$. Therefore, the Rogowski-type current sensor 100 can reduce the occurrence in noise, and thus the current can be measured accurately.

Figure 16:
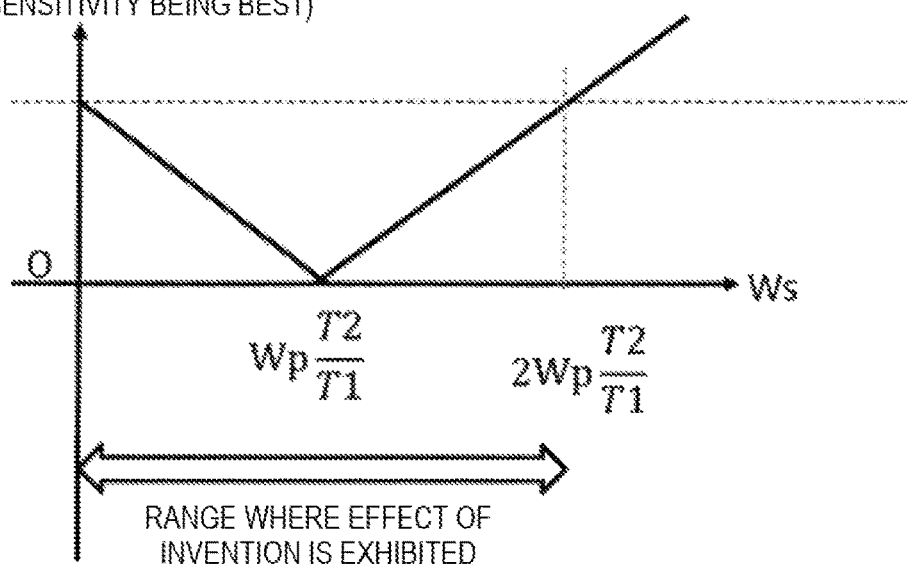
FIG. 16 is a graph for explaining a range in which an effect of the Rogowski coil shown in FIG. 1A or 1B is obtained.

As shown in FIG. 16, when the amount of deviation Ws is greater than 0, the plane Sp is formed and the normal vector is generated in the plane Sp, whereby the influence of the magnetic flux passing through the plane Sp can be reduced.

Further, when the amount of deviation Ws is equal to or greater than $2\times Wp\times T2/T1$, an area of $Ws\times T1$ becomes too large, and the influence on the magnetic flux becomes worse than a case where the amount of deviation Ws is 0.

Therefore, in order to reduce an adverse influence of the magnetic flux due to the plane Sp formed by $Wp\times T2$, the coil 1 is formed to satisfy the relationship of $0<Ws<2\times Wp\times T2/T1$. Thereby, the effect of noise reduction can be obtained.

Therefore, the Rogowski-type current sensor can reduce the occurrence in noise, and can accurately measure the current.

For example, assume that the distance Ws (see FIGS. 14A to 14C) between the through holes 1C and 1D (third side 1c and fourth side 1d) is 96.9 μm, the distance Wp between the coils 1 (the distance as a coil pitch between the fourth side 1d and the adjacent third side 1c) is 420 μm, T1 is 162.5 μm, and T2 is 37.5 μm.

Then, since $Ws\times T1=96.9$ μm$\times 162.3$ μm$=15.7$ mm$^2$, and $Wp\times T2=420$ μm$\times 37.5$ μm$=15.7$ mm$^2$, the relationship of $Ws\times T1=Wp\times T2$ is satisfied.

Therefore, $2\times Wp\times T2/T1$ is $2\times 420$ μm$\times 37.5$ μm/162.5 μm, and the amount of deviation Ws can be allowed up to 193.8 μm.

Thereby, it is possible to reduce the adverse influence of the magnetic flux generated between the coil pitches due to the plane Sp ($Wp\times T2$) interposed between the forward line 2 and the backward line 3.

However, since the through holes 1C and 1D corresponding to the third and fourth sides are drilled by a drill at the time of manufacturing, an error occurs at that time.

For example, when a gap error ε of a drill hole is 40 μm and the amount of deviation Ws is allowed up to 193.8 μm, the amount of deviation Ws may be 193.8 μm+40 μm.

Figure 17:
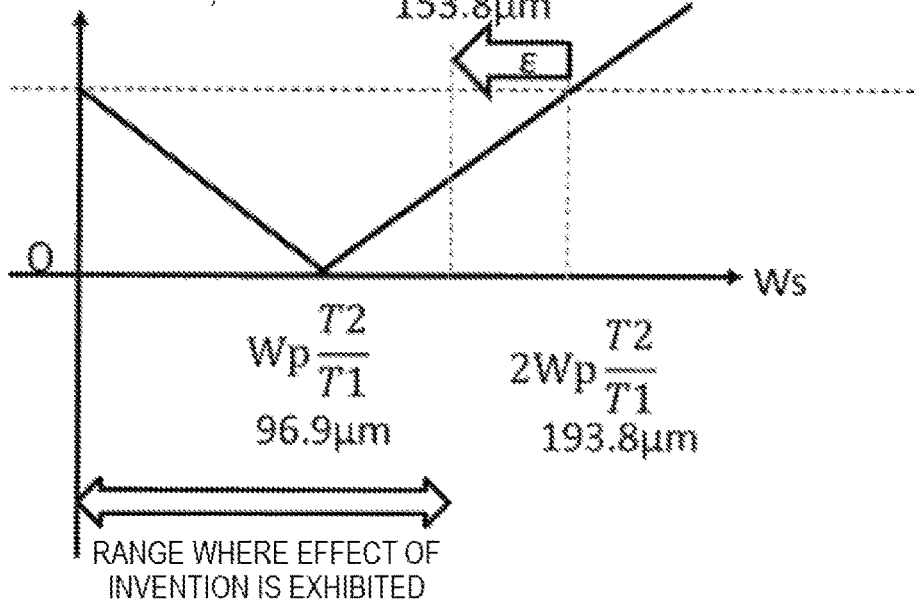
FIG. 17 is a graph for explaining a range in which an effect can be obtained when a gap error of the through hole is taken into consideration from FIG. 16.

Therefore, since it is possible to secure accuracy, in which manufacturing errors are eliminated, by subtracting the gap error ε from a maximum allowable value $2\times Wp\times T2/T1$ of Ws as shown in FIG. 17, a relationship of $0<Ws<2\times Wp\times T2/T1-\varepsilon$ is desirably set, and the maximum allowable amount of the amount of deviation Ws can be set to 193.8 μm-40 μm.

As shown in FIGS. 14A to 14C, the Wp and Ws can be precisely positions of axial lines of the through holes 1C and 1D. Further, as shown in FIG. 15, the T1 can be a distance between an axial line of the first coil pattern 1A and an axial line of the second coil pattern 1B. Furthermore, the T2 can be a distance between the axial line of the first coil pattern 1A and an axial line of the backward line 3.

In the Rogowski coil C, as shown in FIG. 14A, the first coil pattern 1A is formed in a direction orthogonal to the closed line L (see FIG. 3), and the forward line 2 is formed in parallel with the closed line L.

Further, as shown in FIG. 14C, the second coil pattern 1B is formed in a crank shape in which a pair of patterns extending in a direction orthogonal to the closed line L from both end portions are connected to each other by a pattern formed in parallel with the closed line L.

Figure 18:
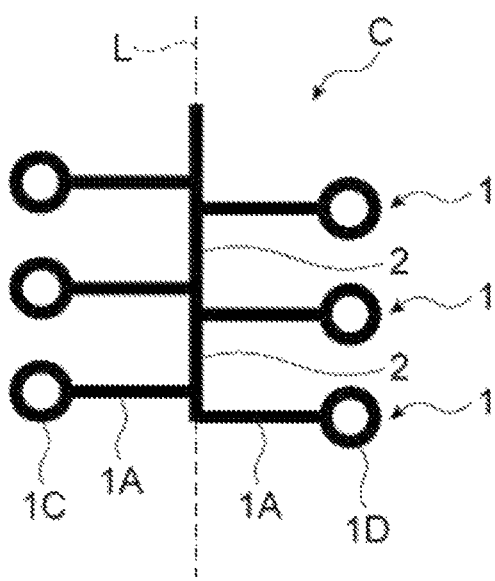
FIG. 18 is a view of the Rogowski coil shown in FIG. 3 as viewed from above.

When the Rogowski coil C is formed in this way and the Rogowski coil C is viewed from the thickness direction (above) as shown in FIG. 18, the plane of the coil 1 cannot be seen, and thus noise resistance can be improved.

Furthermore, a connection pattern 123 connected to the first coil 1 (see FIG. 3) formed on the first layer as shown in FIG. 5A and a connection pattern 123 connected to the backward line 3 formed on the second layer as shown in FIG. 6A are formed at an overlaying position in the thickness direction. For this reason, when viewed in the thickness direction, a loop area can be reduced, whereby a parasitic inductance can be reduced and noise resistance can be improved.

In the Rogowski coil C of the present embodiment, as shown in FIG. 18, the first coil pattern 1A is formed in a direction orthogonal to the closed line L, the forward line 2 is formed in parallel with the closed line L, and the second coil pattern 1B is formed in the crank shape in which a pair of patterns extending in the direction orthogonal to the closed line L from both end portions are connected to each other by the pattern formed in parallel with the closed line L.

However, since the through hole 1D is preferably formed at a position deviating in the arrangement direction of the coils from the through hole 1C, as shown in FIGS. 19A to 19C, the first coil pattern 1A and the second coil pattern 1B may be formed in a straight line.

In the present embodiment, the configuration (hereinafter, referred to as a characteristic improvement region), in which the through hole 1D is formed at the position deviating in the arrangement direction of the coils 1 from the through hole 1C, is adopted over the entire region of the Rogowski coil C, and such a configuration is considered to be able to improve the characteristics most effectively.

However, the characteristic improvement region may be applied to a part of the Rogowski coil C depending on usage environments, specifications, and the like. In other words, it is preferable that when the total length of the formed Rogowski coil C is taken as 100%, the formed length of the region (characteristic improvement region) in which the through hole 1D is formed at the position deviating in the arrangement direction of the coils 1 from the through hole 1C is 30% or more, preferably 70% or more, and more preferably 90% or more. When the characteristic improvement region is below 30% of the total length of the Rogowski coil C, there is a possibility that the characteristics cannot be reliably improved. In addition, the characteristic improvement region may be formed continuously in a part of the Rogowski coil C, or the characteristic improvement region may be formed dispersedly in the Rogowski coil C. In other words, the characteristic improvement regions and non-characteristic improvement regions may be provided alternately.

Further, the alignment portion 14 is a mark formed by the conductive pattern, but may be a notch formed in the flexible wiring board or a penetration hole, for example.

Furthermore, in the conventional Rogowski-type current sensors disclosed in Patent Literatures 2 to 4, since a Rogowski coil is formed by spirally winding a conductive wire, there is a large variation in manufacturing, and correction is required for each product with a corresponding analog circuit.

However, in the Rogowski-type current sensor according to the present embodiment, since the Rogowski coil C (see FIG. 2A) is formed by the conductive pattern of the flexible wiring board, the Rogowski coil C can be accurately reproduced, whereby variations in manufacturing can be prevented, and correction of characteristics is unnecessary.

Next, an example will be described in which the Rogowski-type current sensor 100 shown in FIG. 1A or 1B is applied to an inverter.

Figure 20:
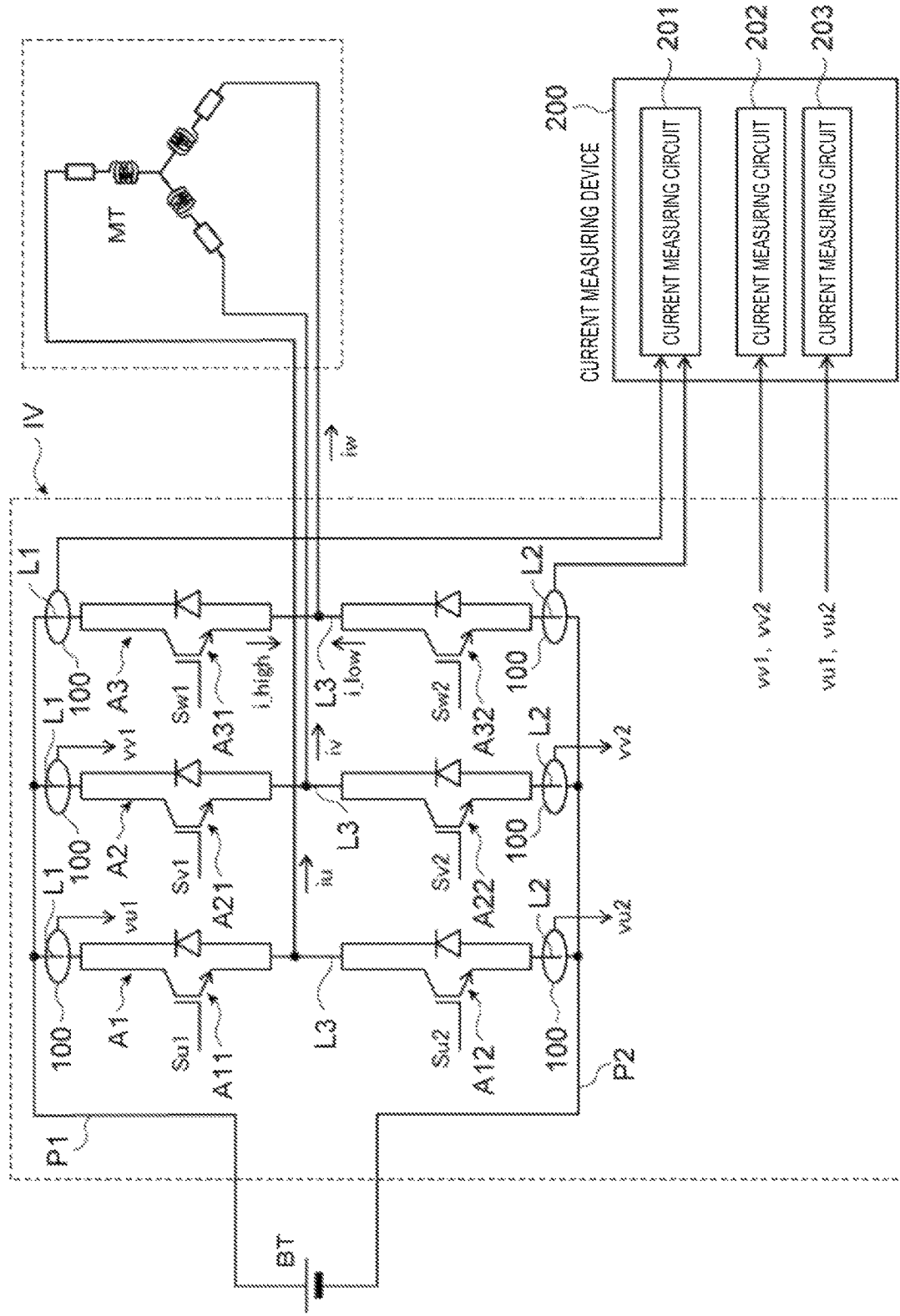
FIG. 20 is a view for explaining an inverter in which the Rogowski-type current sensor shown in FIG. 1A or 1B is mounted on an upper arm and a lower arm as current paths, and a current flowing through the current paths is measured by a current measuring circuit.

An inverter IV shown in FIG. 20 converts a direct current supplied from a battery BT into an alternating current to drive a three-phase alternating current motor MT.

The inverter IV includes three arms, that is, a first arm A1 to a third arm A3, which output a current of each phase and are connected in parallel between one power supply line (a power supply line P1 on a positive electrode side of the battery BT) and the other power supply line (a ground line P2 on a negative electrode side of the battery BT) from the battery BT.

From the first arm A1 to the third arm A3, upper arms A11, A21, and A31 are connected in series to lower arms A12, A22, and A32, respectively.

The upper arms A11 to A31 are connected to the power supply line P1 by a first wiring L1. The lower arms A12 to A32 are connected to the ground line P2 by a second wiring L2. The upper arms A11 to A31 are connected to the lower arms A12 to A32, respectively, by a third wiring L3.

The upper arms A11 to A31 and the lower arms A12 to A32 are composed of switching elements and freewheeling diodes. The switching element is formed by a semiconductor device. As the switching element, for example, a bipolar transistor, an MOSFET (metal-oxide-semiconductor field-effect transistor), or an IGBT (insulated gate bipolar transistor) can be used. In particular, the IGBT is desirable in terms that a large current can flow and a switching speed is fast.

The Rogowski-type current sensor 100 is mounted so as to surround each of both of the first wiring L1 between the power supply line P1 and the upper arms A11 to A31 and the second wiring L2 between the ground line P2 and the lower arms A12 to A32.

A current measuring device 200 is provided to measure a current using the output from the Rogowski-type current sensor 100. The current measuring device 200 includes current measuring circuits 201 to 203 provided for phases, respectively.

The inverter IV includes a controller (not shown) that controls switching between the upper arms A11 to A31 and the lower arms A12 to A32.

Based on a signal output from the current measuring device 200, the controller controls gate signals that serve as switching signals for the first arm A1 to the third arm A3, and adjusts current values and frequencies of output currents iu, iv, and iw from the third wiring L3 of the arms A1 to A3.

Further, the current measuring circuits 201 to 203 of the current measuring device 200 can detect an excessive current flowing from the first arm A1 to the third arm A3 (upper arms A11 to A31, lower arms A12 to A32) and issue an alarm.

In addition, a method of attaching the Rogowski-type current sensor 100 to a member will be described from a different viewpoint.

The Rogowski-type current sensor 100 has the configuration as described above, but the configuration can be expressed as follows. The main body 10 shown in FIG. 1A or 1B is a belt-like body as a whole, has flexibility, and is composed of the flexible wiring board or the like. The main body 10 includes the first main surface 1S, the second main surface 2S opposite to the first main surface and having substantially the same width, and a pair of side surfaces (thickness surfaces having a length corresponding to the thickness of the main body 10, the width of the first main surface 1S and the width of the second main surface 2S being predominantly larger than the width of the side surface 3S) provided between the first main surface 1S and the second main surface 2S.

A cross section of the main body 10 is substantially rectangular. The Rogowski coil C (see FIG. 2A) is embedded inside the main body 10, and the terminal portion (soldering pad 121) electrically joined to the Rogowski coil C is provided at one end of the main body 10. Further, on the side opposite to the side on which the terminal portion is provided, the distal end portion 11 to be joined to the vicinity of the terminal portion later is provided.

Such a Rogowski-type current sensor 100 is mounted in an annular shape so as to surround one or a plurality of terminals of a power semiconductor packaged on a module, for example. In other words, at this time, for example, the Rogowski-type current sensor 100 is deformed into an annular shape such that the first main surface 1S is an inner side and the second main surface 2S is an outer side.

Conversely, the Rogowski-type current sensor 100 may be deformed into an annular shape such that the second main surface 2S is an inner side and the first main surface 1S is an outer side. Then, the terminal portion or the vicinity of the terminal portion and the distal end portion 11 are joined to each other by bonding means such as adhesive, abutment, or caulking to form an annular body shape, and are mounted to a terminal wire of the power semiconductor or the like.

When the main body 10 is mounted in a belt shape with a rectangular cross section and in the annular shape as described above, a specific part of the Rogowski coil C, which is normally formed with a rectangular cross section, can be opposed to the terminal wire of the power semiconductor or the like, and variations in characteristics can be reduced.

In order to electrically join the terminal portion to another apparatus or device, a wiring is joined or a cable is connected via a connection plug, but in this case, before the Rogowski-type current sensor 100 is attached to the terminal wire of the power semiconductor, the wiring may be attached to the terminal wire in an annular shape in a state of being joined to the terminal portion in advance, or the wiring may be subjected to the terminal portion after the Rogowski-type current sensor 100 is attached to the terminal wire.

Such a Rogowski-type current sensor 100 is always mounted to a high-current-adaptive product, and is used to monitor the current during operation of the product. Alternatively, it is used for prototypes of high-current-adaptive products, investigations of defective products, experiments, and characteristic measurements.

Figure 21:
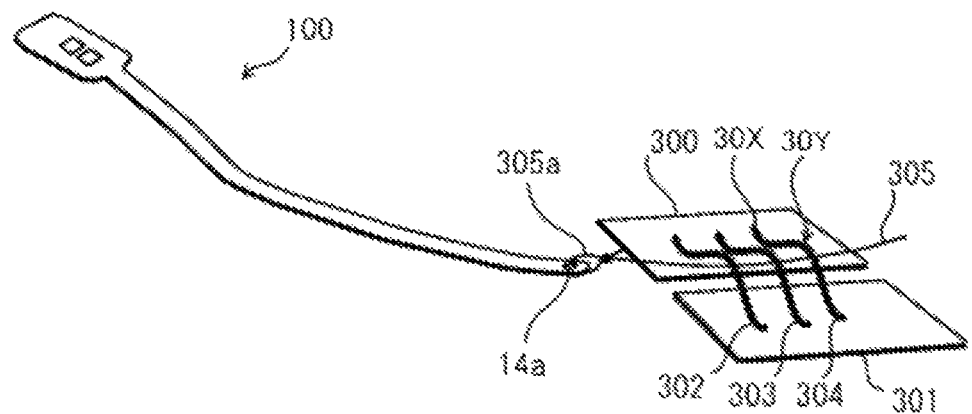
FIG. 21 is a perspective view showing a state before the Rogowski-type current sensor shown in FIG. 1A or 1B is mounted on a current path of a measurement target.

Another embodiment is also conceivable, as shown in FIG. 21. FIG. 21 is a perspective view showing a state before the Rogowski-type current sensor 100 of the present embodiment is mounted to the current path of the measurement target.

In FIG. 21, each of reference numerals 300 and 301 denotes a measurement-target connection portion used for connecting to the current path of the measurement target, and is, for example, an electric component such as a power semiconductor or an electrode caused by a wiring pattern formed on a board (not shown).

Reference numerals 302 to 304 denote lead wires serving as current paths of the measurement target for connecting the measurement-target connection portions 300 and 301 to conduct the measurement-target connection portions 300 and 301, the lead wire being made of a conductive material.

In FIG. 21, three lead wires 302 to 304 are used to electrically connect the measurement target connection portions 300 and 301, but one lead wire, two lead wires, or four or more lead wires may be used for connection.

Both end portions 30X of each of the lead wires 302 to 304 are connected to the measurement-target connection portions 300 and 301, respectively, and an intermediate portion 30Y thereof is bent like a mountain to form an arch.

Therefore, a closed region is formed that is surrounded by the lead wires 302 to 304, which are the current paths of the measurement target, the measurement-target connection portions 300 and 301 connected to both end portions of each of the lead wires 302 to 304, and the board, and a clearance is formed between the intermediate portion 30Y of each of the lead wires 302 to 304 and the board.

The first alignment portion 14a formed at the distal end portion, which is one side of the alignment portion of the Rogowski-type current sensor 100, is configured to be a penetration hole. With such a configuration, a linear body 305 can be directly coupled to the first alignment portion 14a. At this time, for example, an annular coupling portion 305a is formed in the linear body 305. Since the linear body 305 can be coupled to the first alignment portion 14a in this way, the linear body 305 can easily pass through a narrow clearance between the lead wires 302 to 304 and the measurement-target connection portions 300 and 301, or a clearance between the lead wires 302 to 304 and the board on which the measurement-target connection portions 300 and 301 are packaged.

Figure 22:
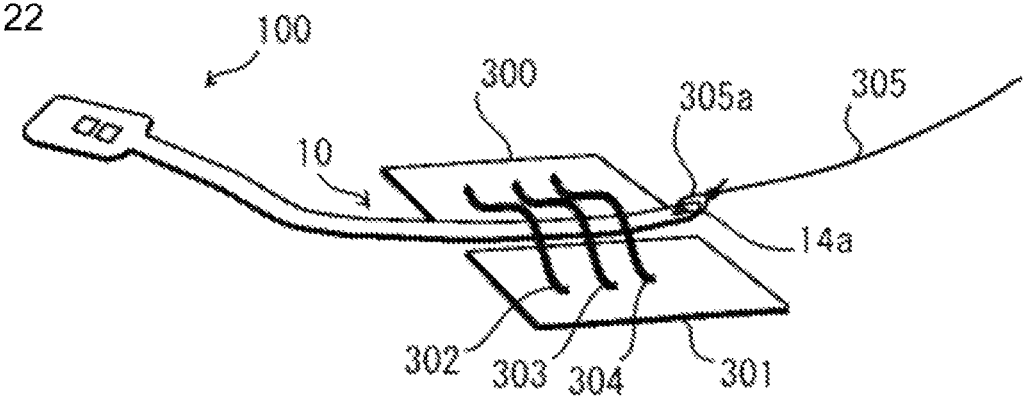
FIG. 22 is a perspective view showing a state in which the Rogowski-type current sensor shown in FIG. 1A or 1B is located on the current path of the measurement target.

Next, the linear body 305 is pulled as shown in FIG. 22, and thus the entire linear body 305 is passed through the closed region until the main body 10 of the Rogowski-type current sensor 100 is located in the closed region formed by the lead wires 302 to 304 and other members.

Then, the Rogowski-type current sensor 100 is bent to wind around the lead wires 302 to 304.

At this time, the Rogowski-type current sensor 100 is annularly mounted on the current path of the measurement target using the mark portion (alignment portion 14 (first alignment portion 14a, second alignment portion 14b)) formed on the Rogowski-type current sensor 100 shown in FIG. 2A as a guide. Thereby, accurate mounting is facilitated, and variations in characteristics can be reduced.

Since such a mark portion is the alignment portion 14, the Rogowski-type current sensor 100 is mounted on the current path of the measurement target using the mark portion as a guide, the proximal end portion and the distal end portion of the Rogowski coil C are overlaid with each other, and thus the end of winding and the start of winding of the Rogowski coil C can be precisely overlaid with each other.

As long as the mark portion can be formed in an annular shape in addition to using the mark portion as the alignment portion, the mark portion may deviate from the position where the start of winding and the end of winding of the Rogowski coil C are overlaid with each other.

In this way, when the Rogowski-type current sensor 100 is wound around the lead wires 302 to 304, there is no clearance because the lead wires 302 to 304 are joined to the measurement-target connection portions 300 and 301, and the Rogowski-type current sensor 100 can be easily passed through a narrow space between the current path of the measurement target and another member even when the Rogowski-type current sensor 100 cannot be inserted from the side in a longitudinal direction.

In the present embodiment, the mark portion may be formed, in addition to being formed by the pad, by providing the penetration hole in the Rogowski-type current sensor, may be formed by printing separately with ink or the like, or may be formed independently of the same material as the electrodes when various electrodes are formed.

Further, since the lead wires 302 to 304 are joined to the measurement-target connection portions 300 and 301, there is no clearance between the end portion of each of the lead wires 302 to 304 and the measurement-target connection portions 300 and 301, and when it is difficult to wind the Rogowski-type current sensor 100 even when there is a slight clearance between the current path of the measurement target and another member in a non-contact state, the Rogowski-type current sensor 100 can wound around the current path of the measurement target as long as the linear body 305 can be passed through the slight clearance by attaching the linear body 305 to the Rogowski-type current sensor 100.

Further, although not shown, when it is desired to insert the Rogowski-type current sensor 100 into one lead wire of the lead wires 302 to 304, for example, only one lead wire 302, the distal end portion (end portion closer to the first alignment portion 14a) of the Rogowski-type current sensor 100 should be passed through the narrow clearance between the lead wires 302 and 303.

However, when the linear body 305 is used as in the present embodiment, since the linear body 305 thinner than the Rogowski-type current sensor 100 can be passed between the lead wires 302 and 303, the linear body 305 can be easily passed through the narrow clearance between the lead wires 302 and 303, whereby the mounting property can be improved.

The linear body 305 can be formed of a flexible filamentous body made of cotton, chemical fibers, or the like, or thin metal or plastic. In addition, as the linear body 305, a filamentous body or the like having a hook portion capable of being easily bent at the distal end is preferably used.

Further, a fishing gut for fishing or the like is used as the linear body 305, and a hook-shaped metal member or a clip-shaped metal member may be attached to the distal end thereof to indirectly attach the linear body 305. Further, the linear body 305 can also be configured by combining a plurality of materials, giving priority to usability.

In other words, although not shown, the coupling portion 305a of the linear body 305 connected to the Rogowski-type current sensor 100 can be formed of an easily deformable material such as a fishing gut, and a resin flat plate or the like having some flexibility can be coupled to the distal end of the linear body 305 mechanically or with an adhesive or the like.

In addition, the linear body 305 formed of the fishing gut can be indirectly connected to the Rogowski-type current sensor 100 via a resin flat plate, depending on specifications.

With such a configuration, when the Rogowski-type current sensor 100 is mounted, the linear body 305 can be appropriately combined with a plurality of materials depending on conditions of the portion to be mounted.

In the embodiment shown in FIG. 22, the fishing gut is tied to the first alignment portion 14a, the fishing gut is inserted into the narrow clearance between the lead wires 302 to 304, and the fishing gut is pulled to pass the Rogowski-type current sensor 100 through the narrow clearance. To make the first alignment portion 14a as the penetration hole, for example, the first alignment portion 14a shown in FIG. 2 is formed in a pattern, but it can be easily realized by forming the penetration hole in the first alignment portion 14a.

Furthermore, as another example, although the number of man-hours is slightly increased, it is possible to connect the linear body 305 to the end portion of the first alignment portion 14a using an adhesive or the like and attach it as shown in FIGS. 21 and 22 even when the penetration hole is not provided in the first alignment portion 14a. At this time, as the adhesive, it is preferable to select a material that allows the linear body 305 and the Rogowski-type current sensor 100 to be easily separated with a predetermined force or more.

INDUSTRIAL APPLICABILITY

The present invention provides an ultra-compact Rogowski-type current sensor that is less susceptible to external magnetic fields and is highly mass-producible, and the Rogowski-type current sensor can be packaged in the inverter to detect an abnormal current, or can be a sensor connected to a measuring instrument for current measurement.

REFERENCE SIGNS LIST

100 ROGOWSKI-TYPE CURRENT SENSOR
10 MAIN BODY
10a DISTAL END
10b PROXIMAL END
11 DISTAL END PORTION
11a PENETRATION HOLE
111 ELONGATED HOLE
12 PROXIMAL END PORTION
121 SOLDERING PAD
121a FIRST PAD
121b SECOND PAD
123 CONNECTION PATTERN
13 MEASURING PORTION
14 ALIGNMENT PORTION
14a FIRST ALIGNMENT PORTION
14b SECOND ALIGNMENT PORTION
15a, 15b COVER FILM
15c PENETRATION HOLE
1, 1c COIL
2, 2c FORWARD LINE
3, 3c BACKWARD LINE
1A FIRST COIL PATTERN
1B SECOND COIL PATTERN
1C, 1D THROUGH HOLE
1C', 1D' ONE CONNECTION PORTION
1C", 1D" OTHER CONNECTION PORTION
C ROGOWSKI COIL
C1 PROXIMAL END PORTION
C2 DISTAL END PORTION
L CLOSED LINE
Ws AMOUNT OF DEVIATION
Wp COIL PITCH
T1, T2 HEIGHT
K1, K2 GAP
W WIRING
F1 LENGTH DIRECTION
S SHIELD LAYER
S1 MESH
Ss, Sp, S0, Sc PLANE
H, H1, H2 HOUSING
H1a, H2a INSERTION HOLE
H1b CONVEX PORTION
H2b ABUTMENT PORTION
IV INVERTER
BT BATTERY
MT THREE-PHASE ALTERNATING CURRENT MOTOR
200 CURRENT MEASURING DEVICE
201 to 203 CURRENT MEASURING CIRCUIT
P1 POWER SUPPLY LINE
P2 GROUND LINE
A1 FIRST ARM
A2 SECOND ARM
A3 THIRD ARM
A11 to A31 UPPER ARM
A12 to A32 LOWER ARM
L1 FIRST WIRING
L2 SECOND WIRING
L3 THIRD WIRING
1S FIRST MAIN SURFACE
2S SECOND MAIN SURFACE
3S SIDE SURFACE
300, 301 MEASUREMENT-TARGET CONNECTION PORTION
302 to 304 LEAD WIRE
30X END PORTION
30Y INTERMEDIATE PORTION
305 LINEAR BODY
305a COUPLING PORTION

The invention claimed is:

1. A Rogowski-type current sensor comprising a main body formed from a belt-shaped flexible wiring board and capable of surrounding a current path of a measurement target, the main body including a measuring portion in which a Rogowski coil is formed in a length direction by a conductive pattern, wherein the Rogowski coil is configured in which a plurality of coils constituting the Rogowski coil are continuously connected along a closed line formed when surrounding the current path of the measurement target, by a forward line parallel to the closed line, between an end of winding of any coil and a start of winding of a next coil among coils adjacent to each other, and has a backward line parallel to the closed line from an end of winding of a last coil of the plurality of coils toward a start of winding of a first coil, the coil is formed from a first side having an end of winding of the coil and a start of winding of the next coil, a second side located on a side opposite to the first side, and third side and fourth side connecting both end portions of the first side and the second side, and one side of the third side and the fourth side is a plane including the other side, and is formed at a position deviating from a plane orthogonal to the closed line, and when a value indicating a coil pitch between the coils is defined as Wp, a value indicating an amount of deviation between the third side and the fourth side is defined as Ws, a value indicating a height from a second side to the first side is defined as T1, and a value indicating a height from the backward line to the first side is defined as T2, a relationship of 0<Ws<2×Wp×T2/T1 is satisfied.

2. The Rogowski-type current sensor according to claim 1, wherein the main body is formed from a belt-shaped flexible wiring board and capable of surrounding a current path of a measurement target, the main body including a measuring portion in which a Rogowski coil is formed in a length direction by a conductive pattern and a proximal end portion provided one end portion of the measuring portion and wider than the measuring portion.

3. The Rogowski-type current sensor according to claim 2, wherein a fixture is provided to fix the proximal end portion and the distal end portion of the Rogowski coil in an overlaying state when the main body surrounds the current path of the measurement target.

4. The Rogowski-type current sensor according to claim 3, wherein the main body is formed with a fitted portion including a concave portion, a penetration hole, or a convex portion at either one of the proximal end portion and the distal end portion of the main body, the fixture is formed with an insertion hole into which the one of the proximal end portion and the distal end portion is inserted to be capable of being overlaid with the other, on an inner wall of the insertion hole, a fitting portion is formed including a convex portion fitting into the concave portion or the penetration hole of the fitted portion, or a concave portion or a penetration hole fitting into the convex portion of the fitted portion, and the proximal end portion and the distal end portion of the Rogowski coil are overlaid with each other when the fitting portion is fitted into the fitted portion.

5. The Rogowski-type current sensor according to claim 3, wherein the fixture is formed with an insertion hole into which either one of the proximal end portion and the distal end portion is inserted to be capable of being overlaid with the other, and the insertion hole is formed with an abutment portion that stops insertion at a position where the proximal end portion and the distal end portion of the Rogowski coil are overlaid with each other when the one of the proximal end portion and the distal end portion is inserted.

6. The Rogowski-type current sensor according to claim 1, wherein the main body is formed with an alignment portion capable of allowing a proximal end portion and a distal end portion of the Rogowski coil to be overlaid with each other when surrounding the current path of the measurement target.

7. The Rogowski-type current sensor according to claim 1, wherein a grid-like mesh formed by a conductive pattern and intersecting in the length direction is formed on a pair of layers with the Rogowski coil interposed therebetween.

8. The Rogowski-type current sensor according to claim 1, wherein a flexible portion is formed closer to a distal side than the measuring portion in the length direction of the main body at a distal end portion of the main body.

9. The Rogowski-type current sensor according to claim 1, wherein the flexible wiring board includes at least three conductive pattern layers, each of the coils is formed from a first coil pattern that is formed on a first layer and is the first side to which the forward line and the forward line are connected, a second coil pattern that is formed on a third layer and is the second side parallel to the first coil pattern, and a pair of through holes that are the third side and the fourth side connecting an end portion of the first coil pattern and an end portion of the second coil pattern, and the forward line is formed on a second layer between the first layer and the third layer.

10. The Rogowski-type current sensor according to claim 9, wherein the first coil pattern is formed in a direction orthogonal to the closed line, the backward line is formed parallel to the closed line, and the second coil pattern is formed in a crank shape in which a pair of patterns extending in the direction orthogonal to the closed line from both end portions are connected to each other by a pattern formed in parallel with the closed line.

11. The Rogowski-type current sensor according to claim 1, wherein the amount of deviation Ws and the coil pitch Wp have a relationship of Ws×T1=Wp×T2.

12. The Rogowski-type current sensor according to claim 1, wherein the main body is formed with a signal takeout pad at a proximal end portion, and a connection pattern connected to the first coil and a connection pattern connected to the backward line are formed at an overlaying position in a thickness direction.

13. The Rogowski-type current sensor according to claim 1, wherein when the main body surrounds the current path of the measurement target and the proximal end portion and the distal end portion of the Rogowski coil face each other, the proximal end portion and the distal end portion are not in contact with each other, and the proximal end portion and the distal end portion of the Rogowski coil are formed at the same position or close to each other.

14. The Rogowski-type current sensor according to claim 13, wherein a gap in the thickness direction when the proximal end portion and the distal end portion of the Rogowski coil face each other is 1 mm or less.

15. The Rogowski-type current sensor according to claim 13, wherein a gap in the length direction when the proximal end portion and the distal end portion of the Rogowski coil face each other is ±1 mm or less.

16. An inverter comprising:
the Rogowski-type current sensor according to claim 1; and
a current measuring circuit that uses an output from the Rogowski-type current sensor that winds either one or both of an upper arm and a lower arm as the current paths connected in series between one power supply line and the other power supply line from a power supply, and measures a current flowing in the current paths.

17. A method of mounting the Rogowski-type current sensor according to claim 1,
wherein:
the Rogowski-type current sensor is configured on the current path of the measurement target;
the belt-shaped flexible main body of the Rogowski-type current sensor has a first main surface, a second main surface opposite to the first main surface, and a pair of side surfaces; and
the Rogowski coil is embedded in the main body, and has a proximal end portion provided on one end portion of the measuring portion and wider than the measuring portion, the method comprising mounting, on the current path of the measurement target, the Rogowski-type current sensor surrounding the current path of the measurement target such that one of the first main surface and the second main surface is an inner side.

18. The method according to claim 17,
wherein a linear body is directly or indirectly coupled to one end portion of the Rogowski-type current sensor, the linear body is inserted into a clearance between the current path of the measurement target and another member, and then the linear body is moved to wind and mount the Rogowski-type current sensor on the current path of the measurement target.

19. A method of mounting the Rogowski-type current sensor according to claim 1,
wherein in the Rogowski-type current sensor, the Rogowski coil has a proximal end portion provided on one end portion of the measuring portion and wider than the measuring portion,
the method comprising surrounding and mounting the Rogowski-type current sensor on a current path of a measurement target, using mark portions formed on both end portion of the Rogowski-type current sensor as guides.

* * * * *